United States Patent
Sung et al.

(10) Patent No.: US 12,238,982 B2
(45) Date of Patent: *Feb. 25, 2025

(54) DISPLAY DEVICE INCLUDING LIGHT-BLOCKING LAYER AND SENSOR LAYER

(71) Applicant: Samsung Display Co., LTD., Yongin-si (KR)

(72) Inventors: Eun Jin Sung, Yongin-si (KR); Seong Ryong Lee, Yongin-si (KR); Jae Kyoung Kim, Yongin-si (KR); Won Sang Park, Yongin-si (KR); Jong In Baek, Yongin-si (KR); Bong Hyun You, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 10 days.

This patent is subject to a terminal disclaimer.

(21) Appl. No.: 16/892,682

(22) Filed: Jun. 4, 2020

(65) Prior Publication Data
US 2020/0395433 A1 Dec. 17, 2020

(30) Foreign Application Priority Data
Jun. 11, 2019 (KR) .................. 10-2019-0068940

(51) Int. Cl.
*H10K 59/131* (2023.01)
*H10K 50/86* (2023.01)
*H10K 59/60* (2023.01)

(52) U.S. Cl.
CPC ......... *H10K 59/131* (2023.02); *H10K 50/865* (2023.02); *H10K 59/60* (2023.02)

(58) Field of Classification Search
CPC .............. H01L 27/3276; H01L 27/3227; H01L 51/5284; H01L 27/3234; H01L 27/323;
(Continued)

(56) References Cited

U.S. PATENT DOCUMENTS 7,663,306 B2 * 2/2010 Imamura .............. H01L 51/5228
313/506
9,276,239 B2 3/2016 Park et al.
(Continued)

FOREIGN PATENT DOCUMENTS

CN 107799567 A 3/2018
CN 108269520 A 7/2018
(Continued)

OTHER PUBLICATIONS

Non-Final Office Action dated Jun. 23, 2023, in U.S. Appl. No. 18/094,924.
(Continued)

*Primary Examiner* — Nduka E Ojeh
*Assistant Examiner* — Laura M Dykes
(74) *Attorney, Agent, or Firm* — Lewis Roca Rothgerber Christie LLP

(57) ABSTRACT

A display device includes: a substrate including a display area having a plurality of pixel areas and a non-display area surrounding at least one side of the display area; a light-blocking layer disposed on a first surface of the substrate and including light transmissive areas to allow incident light to pass therethrough; a circuit-element layer disposed on the light-blocking layer and including a plurality of conductive layers; a light-emitting element layer disposed on the circuit-element layer and including light-emitting elements; and a sensor layer disposed on a second surface of the substrate opposing the first surface to sense the light passing through the light transmissive areas. The light-blocking layer is electrically coupled to at least one of the plurality of conductive layers.

21 Claims, 22 Drawing Sheets

(58) Field of Classification Search
CPC .............. H01L 27/3279; H01L 27/156; G06V 40/1318; H10K 59/131; H10K 50/865; H10K 59/60; H10K 59/126; H10K 59/40; H10K 59/65; H10K 59/1213; H10K 59/122; H10K 59/123; H10K 59/1315; H10K 50/805
USPC .......................................................... 257/40
See application file for complete search history.

(56) References Cited

U.S. PATENT DOCUMENTS

| | | | |
|---|---|---|---|
| 9,501,686 | B2 | 11/2016 | Lin |
| 9,768,310 | B2 | 9/2017 | Ahn et al. |
| 10,083,335 | B2 | 9/2018 | Zhang |
| 10,268,296 | B2 | 4/2019 | Choi et al. |
| 10,268,884 | B2 | 4/2019 | Jones et al. |
| 10,283,578 | B2 | 5/2019 | Ka et al. |
| 10,360,430 | B2 | 7/2019 | Zhang et al. |
| 10,360,431 | B2 | 7/2019 | Gozzini et al. |
| 10,651,264 | B2 | 5/2020 | An et al. |
| 10,734,458 | B2 | 8/2020 | Kang et al. |
| 10,784,331 | B2 | 9/2020 | Zeng et al. |
| 10,943,082 | B2 | 3/2021 | Jang et al. |
| 11,152,435 | B2 | 10/2021 | Ryu et al. |
| 2008/0197778 | A1* | 8/2008 | Kubota ............... H01L 51/5228 315/73 |
| 2009/0279168 | A1 | 11/2009 | Hiwatashi et al. |
| 2013/0308193 | A1 | 11/2013 | Ogawa |
| 2017/0090083 | A1 | 3/2017 | Takishita et al. |
| 2017/0249494 | A1 | 8/2017 | Zhang et al. |
| 2017/0278909 | A1 | 9/2017 | Jeon et al. |
| 2017/0351898 | A1 | 12/2017 | Langdon et al. |
| 2018/0046837 | A1 | 2/2018 | Gozzini et al. |
| 2018/0069069 | A1* | 3/2018 | Ebisuno ............... H10K 59/352 |
| 2018/0075278 | A1 | 3/2018 | Zhang |
| 2018/0182985 | A1* | 6/2018 | Kang ................... G06F 1/1652 |
| 2018/0247100 | A1 | 8/2018 | Zhu et al. |
| 2018/0284927 | A1 | 10/2018 | Kim et al. |
| 2018/0294299 | A1 | 10/2018 | Baek et al. |
| 2018/0362810 | A1 | 12/2018 | Bogner et al. |
| 2019/0006440 | A1 | 1/2019 | Sun et al. |
| 2019/0050621 | A1* | 2/2019 | Xu ..................... G06V 40/1318 |
| 2019/0080140 | A1 | 3/2019 | Lee et al. |
| 2019/0095674 | A1 | 3/2019 | Ko et al. |
| 2019/0205594 | A1 | 7/2019 | Lee et al. |
| 2019/0228204 | A1 | 7/2019 | Park et al. |
| 2019/0278968 | A1 | 9/2019 | Yoshii et al. |
| 2019/0354789 | A1 | 11/2019 | Gu et al. |
| 2020/0065547 | A1 | 2/2020 | Ryu et al. |
| 2020/0066825 | A1* | 2/2020 | Yang ..................... H10K 59/124 |
| 2020/0104562 | A1 | 4/2020 | Sung et al. |
| 2020/0203468 | A1* | 6/2020 | Zeng ................... H01L 27/3276 |
| 2020/0219915 | A1 | 7/2020 | Kim et al. |
| 2020/0219946 | A1 | 7/2020 | Ryu et al. |
| 2020/0219948 | A1 | 7/2020 | Kim et al. |
| 2020/0395433 | A1 | 12/2020 | Sung et al. |
| 2021/0233988 | A1* | 7/2021 | Wei ..................... G09G 3/3233 |
| 2021/0366933 | A1* | 11/2021 | Zhang ................. H01L 23/552 |
| 2022/0109029 | A1 | 4/2022 | Ryu et al. |

FOREIGN PATENT DOCUMENTS

| | | |
|---|---|---|
| CN | 109103231 | 12/2018 |
| CN | 109309109 A | 2/2019 |
| CN | 109686770 A | 4/2019 |
| JP | 5757775 | 7/2015 |
| KR | 10-2014-0100853 | 8/2014 |
| KR | 10-2015-0028055 A | 3/2015 |
| KR | 10-2015-0075512 | 7/2015 |
| KR | 10-2016-0062831 | 6/2016 |
| KR | 10-2017-0027349 | 3/2017 |
| KR | 10-2017-0106621 A | 9/2017 |
| KR | 10-2018-0001904 | 1/2018 |
| KR | 10-2018-0003363 | 1/2018 |
| KR | 10-2018-0047579 | 5/2018 |
| KR | 10-2018-0061482 A | 6/2018 |
| KR | 10-1884254 | 8/2018 |
| KR | 10-2018-0100140 | 9/2018 |
| KR | 10-2018-0113885 | 10/2018 |
| KR | 10-2019-0037391 A | 4/2019 |
| KR | 10-2019-0107215 | 9/2019 |
| KR | 10-2020-0023567 | 3/2020 |
| KR | 10-2020-0038388 | 4/2020 |
| KR | 10-2020-0085397 | 7/2020 |
| KR | 10-2020-0085401 | 7/2020 |
| KR | 10-2020-0085403 | 7/2020 |
| WO | 2018214481 | 11/2018 |

OTHER PUBLICATIONS

US Final Office Action dated Oct. 26, 2023, issued in U.S. Appl. No. 18/094,924 (8 pages).

US Office Action dated Feb. 15, 2024, issued in U.S. Appl. No. 18/094,924 (9 pages).

US Final Office Action dated Sep. 16, 2024, issued in U.S. Appl. No. 18/094,924 (10 pages).

US Notice of Allowance dated Nov. 27, 2024, issued in U.S. Appl. No. 18/094,924 (7 pages).

* cited by examiner

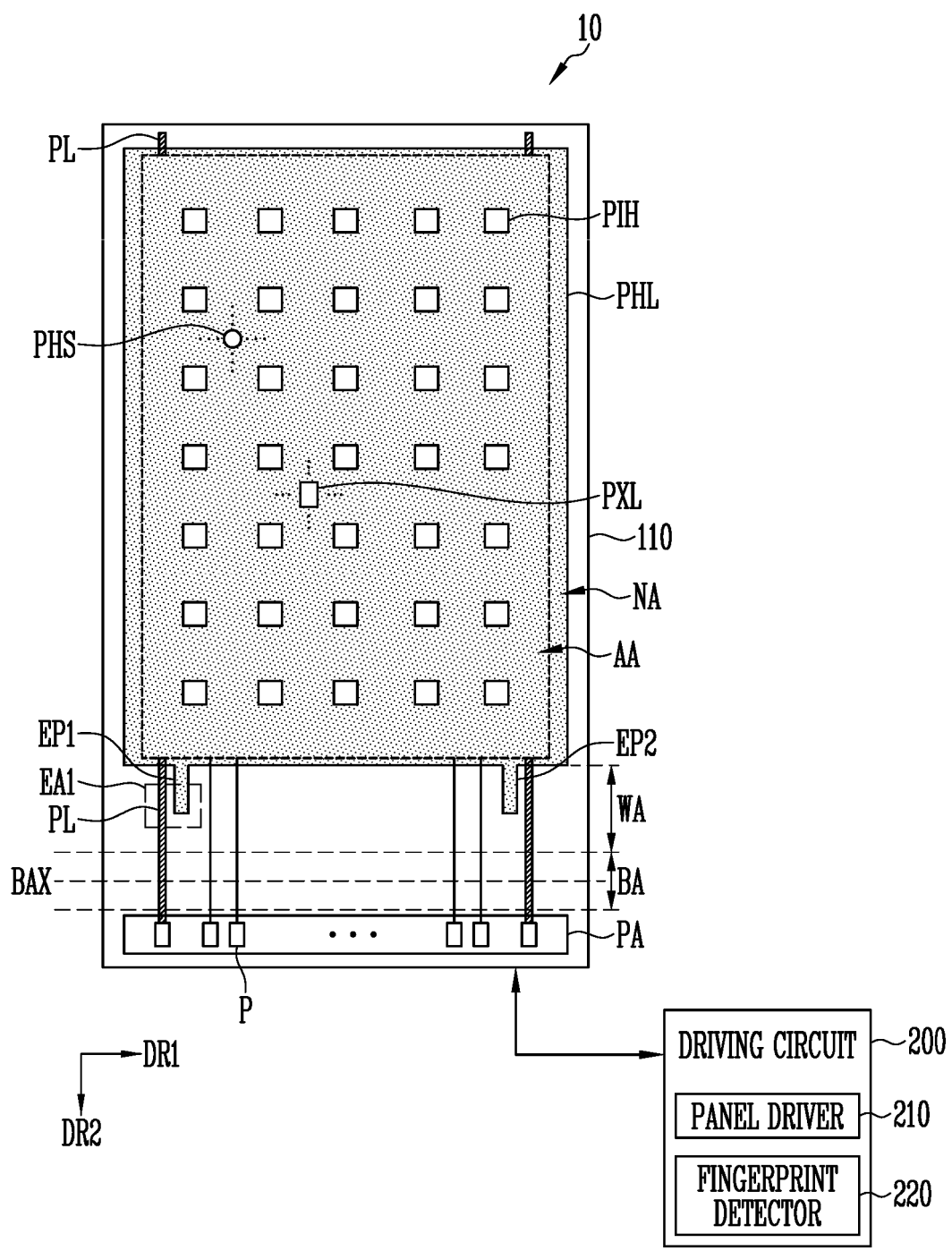

DISPLAY DEVICE INCLUDING LIGHT-BLOCKING LAYER AND SENSOR LAYER

CROSS-REFERENCE TO RELATED APPLICATION

This application claims priority from and the benefit of Korean Patent Application No. 10-2019-0068940 filed on Jun. 11, 2019, which is hereby incorporated by reference for all purposes as if fully set forth herein.

BACKGROUND

Field

Exemplary implementations of the invention generally relate to a display device and, more specifically, to a display device including photosensors to detect light.

Discussion of the Background

Recently, with the utilization of a display device, such as a smartphone or a tablet PC, in various fields, schemes for authenticating biometric information using a user's fingerprint or the like have been widely used. In order to provide a fingerprint sensing function, a fingerprint sensor may be provided in a form in which the fingerprint sensor is contained in a display device or attached to the display device.

The fingerprint sensor may be implemented as, for example, a photo-sensing-type sensor. A photo-sensing-type fingerprint sensor may comprise a light source, a lens, and a photosensor array. To conduct light reflected by a fingerprint to the photosensor array, light transmission holes may be extensively formed over a wide area in the circuit-element layer of the display panel. Moreover, when such a fingerprint sensor is attached to a display panel, the thickness of a display device and manufacturing costs thereof may be increased.

The above information disclosed in this Background section is only for understanding of the background of the inventive concepts, and, therefore, it may contain information that does not constitute prior art.

SUMMARY

Applicant discovered that when light transmission holes are extensively formed over a wide area in the circuit-element layer of a display panel having an integrated fingerprint sensor, the load acting on lines formed on the circuit-element layer, for example, scan lines, data lines, etc., may be increased. Such an increase in the load may increase power consumption of the display device. In addition, when the light transmission holes are extensively formed over a wide area in the circuit-element layer, cross-talk with elements, e.g., transistors, of respective pixels occurs, thus deteriorating the quality of the display panel.

Display devices constructed according to the principles and exemplary implementations of the invention are capable of sensing light and/or fingerprint with improved accuracy and/or efficiency. For example, a display device may include a conductive light-blocking layer electrically coupled to a certain component in a pixel such that power applied to the certain component in the pixel may be transferred to the light-blocking layer, which may cause a light-emitting element in the pixel to receive an increased and/or desired amount of current. Accordingly, the light-emitting element may emit an increase and/or desired amount of light, and the photosensors of the display device may effectively sense the light reflected by an object such as a fingerprint.

According to other aspects and exemplary implementations of the invention, fingerprint sensing capability may be improved by assigning a function of selectively blocking specific wavelengths of light to an insulating layer or the like included in the display device.

Additional features of the inventive concepts will be set forth in the description which follows, and in part will be apparent from the description, or may be learned by practice of the inventive concepts.

According to one aspect of the invention, a display device includes: a substrate including a display area having a plurality of pixel areas and a non-display area surrounding at least one side of the display area; a light-blocking layer disposed on a first surface of the substrate and including light transmissive areas to allow incident light to pass therethrough; a circuit-element layer disposed on the light-blocking layer and including a plurality of conductive layers; a light-emitting element layer disposed on the circuit-element layer and including light-emitting elements; and a sensor layer disposed on a second surface of the substrate opposing the first surface to sense the light passing through the light transmissive areas, wherein the light-blocking layer is electrically coupled to at least one of the plurality of conductive layers.

The light-blocking layer may be configured to receive power through the at least one of the plurality of conductive layers.

The plurality of conductive layers may include a power line extending in one direction and configured to receive the power.

The light-blocking layer may be electrically coupled to the power line through at least one contact hole in the non-display area.

The light-blocking layer may include at least one extension part extending from at least one portion of a periphery of the light-blocking layer towards a perimeter of the substrate and disposed adjacent to the power line in the non-display area.

The at least one extension part may be electrically coupled to the power line through at least one contact hole in the non-display area.

The plurality of conductive layers may further include a connector interposed between the at least one extension part and the power line, the at least one extension part may be electrically coupled to the connector through at least one first contact hole, and the connector may be electrically coupled to the power line through at least one second contact hole.

The connector may include a bridge pattern, the at least one extension part may include a protrusion pattern configured to protrude from the at least one extension part towards the power line to overlap the power line, and the protrusion pattern may be electrically coupled to the power line through the at least one contact hole.

The power line may include a protrusion pattern configured to protrude towards the at least one extension part of the light-blocking layer to overlap the extension part, and the protrusion pattern may be electrically coupled to the at least one extension part through the at least one contact hole.

The non-display area may include: a pad area including pads to be coupled to an external controller; a bending area adjacent to the pad area and bendable about a bending axis; and a wiring area interposed between the bending area and the display area, and wherein the plurality of conductive layers includes a plurality of lines in the wiring area, and the plurality of lines and the power line extend from the pads to the display area.

The at least one extension part may be electrically coupled to the power line through at least one contact hole in the wiring area.

The power line may have a width greater than that of the plurality of lines in the wiring area.

The non-display area may further include a dummy area adjacent to the display area, the display area being disposed between the peripheral area and the wiring area, and the at least one extension part may be disposed in at least one of the wiring area and the dummy area.

The light-blocking layer may be electrically coupled to the power line through a contact hole in the display area.

The plurality of conductive layers in the display area may include: a semiconductor layer including an active pattern forming at least one transistor; a first gate layer including a gate electrode overlapping the active pattern; a second gate layer including at least one capacitor electrode; and a source-drain layer including the power line and a conductive line coupled to the active pattern.

The contact hole may include a first contact hole and a second contact hole, and the second gate layer may further include a connector electrically coupled to the light-blocking layer through the first contact hole and electrically coupled to the power line through the second contact hole.

The connector may be a bridge pattern that includes: a first area extending in parallel to the power line; and a second area extending from a first end of the first area in a direction perpendicular to the first area.

The first area may overlap the power line and is electrically coupled to the first contact hole and the second contact hole.

The plurality of conductive layers may include light transmissive holes overlapping the light transmissive areas.

The light transmissive areas may include pinholes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIGS. 1A to 1C are schematic plan views of exemplary embodiments of a display device constructed according to the principles of the invention.

DETAILED DESCRIPTION

Figure 1A:
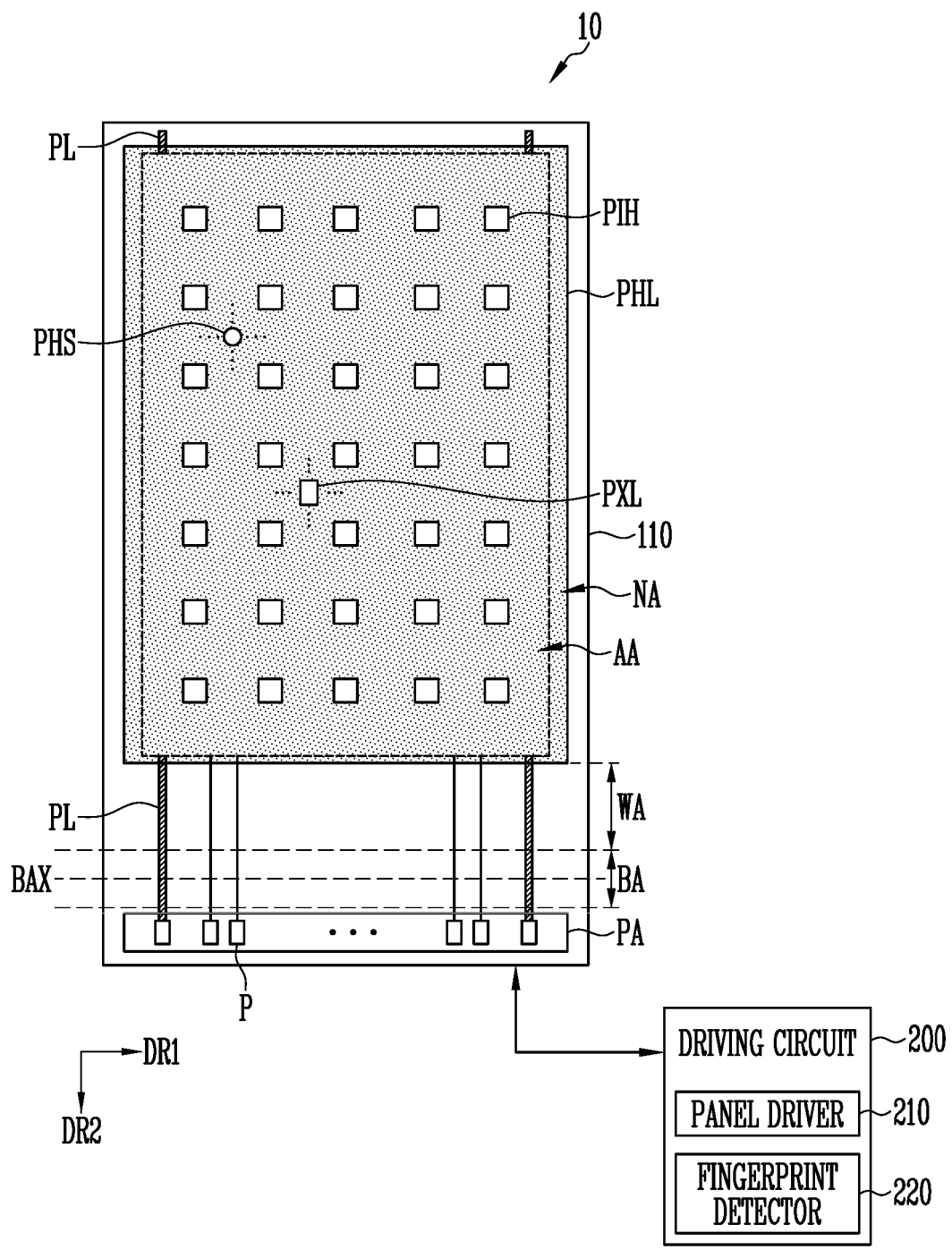

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1C:
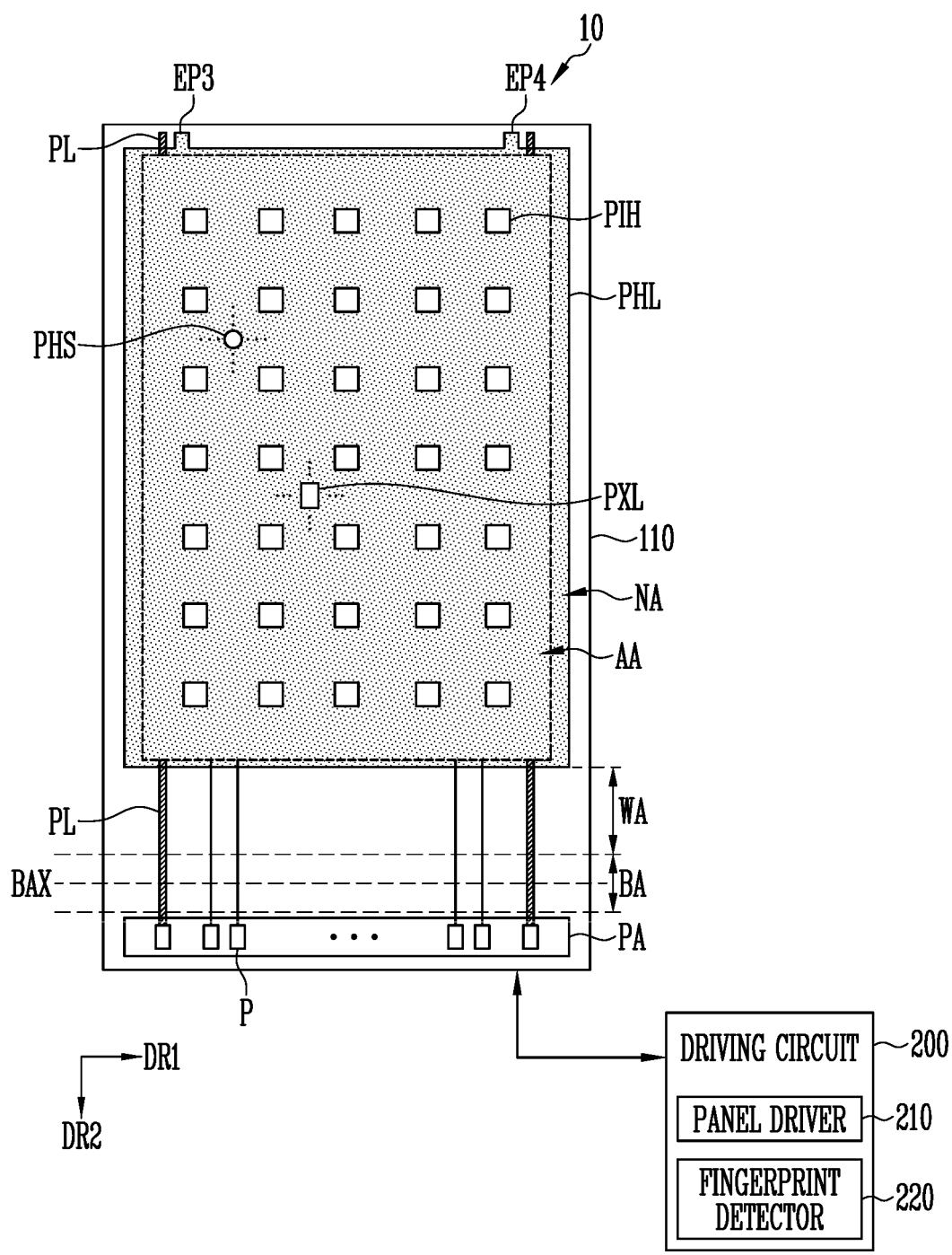

FIGS. 1A to 1C are schematic plan views of exemplary embodiments of a display device constructed according to the principles of the invention. In detail, FIGS. 1A to 1C are diagrams schematically illustrating a display panel provided in a display device and a driving circuit for driving the display panel. For convenience of description, the display panel and the driving circuit are separately illustrated in FIGS. 1A to 1C, but exemplary embodiments are not limited thereto. For example, all or part of the driving circuit may be integrated into the display panel.

A display device 10 may be provided in various shapes. For example, the display device 10 may be provided in the shape of a generally rectangular plate having two pairs of parallel sides. The display panel 10 may display arbitrary visual information, e.g., text, a video, a picture, and a two-dimensional (2D) or three-dimensional (3D) image.

All or at least a part of the display device 10 may have flexibility. For example, the display device 10 may have flexibility in the entire area, or may have flexibility in a partial area corresponding to a flexible area.

Referring to FIGS. 1A to 1C, the display device 10 may include a display panel 110 and a driving circuit 200 for driving the display panel 110.

The display panel 110 may include a display area AA and a non-display area NA. The display area AA may be an area in which a plurality of pixels PXL (or also referred to as "sub-pixels") are provided, and may be designated as an active area. In exemplary embodiments, each of the pixels PXL may include at least one light-emitting element. The light-emitting element may be, but is not limited to, an organic light-emitting diode or a micro-sized inorganic light-emitting diode having a size falling within a microscale or nanoscale range. The display device 10 displays an image in the display area AA by driving the pixels PXL in accordance with externally applied image data.

The non-display area NA may be an area surrounding the display area AA, and may be designated as a non-active area. In exemplary embodiments, the non-display area NA may inclusively mean the remaining area other than the display area AA on the display panel 110.

In exemplary embodiments, the non-display area NA may include a bending area BA, a wiring area WA, a pad area PA, and various types of dummy areas.

The bending area BA may be bent about a bending axis BAX. The bending area BA may mean an area having the radius of curvature after being bent. In an exemplary embodiment, the bending area BA may be formed between the display area AA and the pad area PA, and may form, for example, a part of the wiring area WA.

The pad area PA is arranged at one end of the non-display area NA and includes a plurality of pads P. The pad area PA may be exposed without being covered by an insulating layer, and may then be electrically coupled to a controller such as a flexible printed circuit board and a driver Integrated Circuit (IC) and/or the driving circuit 200, which will be described later. The controller and/or the driving circuit 200 may provide data signals, scan signals, first power ELVDD, second power ELVSS, etc.

The wiring area WA may include a plurality of lines (wires) for coupling the pads P to the display area AA. The lines may be coupled to the pads P, and may then supply electrical signals to the pixels PXL arranged in the display area AA. The lines may include, for example, scan lines, data lines, a power line PL, etc. For example, the power line PL may be coupled to the controller through at least some pads P, and may supply the first power ELVDD, provided from the controller, to the pixels. In an exemplary embodiment, at least two power lines PL may be provided, but exemplary embodiments are not limited thereto. Also, as illustrated in FIG. 1A, the power line PL may be formed with a width (here, the width is a length in a direction perpendicular to the elongate longitudinal direction) much greater than those of other lines (e.g., scan lines, data lines, etc.).

The lines may extend across the bending axis BAX. In an exemplary embodiment, the lines may obliquely extend at a predetermined angle with respect to the bending axis BAX. Further, the lines may have various shapes, such as a curved shape or a zigzag shape, rather than a linear shape.

In exemplary embodiments, the display device 10 may further include a plurality of photosensors PHS provided in the display area AA. In an exemplary embodiment, the photosensors PHS may detect that light emitted from a light source is reflected from a user's finger, may analyze reflected light, and may then detect the user's fingerprint. Hereinafter, although an example in which the photosensors PHS are used to detect a fingerprint will be described, the photosensors PHS may be used to perform various functions, as in the case of a touch sensor or a scanner in various exemplary embodiments.

In exemplary embodiments, the photosensors PHS may be arranged in the display area AA. Here, the photosensors PHS may be arranged to overlap at least some or all of the pixels PXL provided in the display area AA, or may be arranged near the pixels PXL. For example, at least some or all of the photosensors PHS may be provided between the pixels PXL. Exemplary embodiments of arrangement relationships between the photosensors PHS and the pixels PXL will be described in detail later with reference to FIGS. 3A to 3D.

In an exemplary embodiment in which the photosensors PHS are arranged adjacent to the pixels PXL, the photosensors PHS may use a light-emitting element, which is provided in at least one pixel PXL arranged in the display area AA, as a light source. In this embodiment, the photosensors PHS may constitute a photo-sensing-type fingerprint sensor, together with the pixels PXL of the display area AA, in particular, light-emitting elements provided in the pixels PXL. In this way, when a fingerprint sensor-embedded display device is configured to use the pixels PXL as light sources without requiring a separate external light source, the module thickness of the display device equipped with the photo-sensing-type fingerprint sensor may be reduced, and manufacturing costs thereof may be reduced.

In exemplary embodiments, the photosensors PHS may be arranged on a second surface (e.g., a rear surface) opposing a first surface on which an image is displayed (e.g., a front surface) between two surfaces of the display panel 110. However, exemplary embodiments are not limited thereto.

In exemplary embodiments, the display device 10 may further include a light-blocking layer PHL. The light-blocking layer PHL may be disposed in the display panel 110 or between the display panel 110 and the photosensors PHS, thus blocking part of light incident on the photosensors PHS. For example, the light-blocking layer PHL may selectively block and pass light reflected (hereinafter referred to as "reflected light") from an object, for example, a finger, coming into contact with the top of the display panel 110. Part of light incident on the light-blocking layer PHL may be blocked, and the remaining part of the incident light may reach the photosensors PHS below the light-blocking layer PHL after passing through light transmissive areas of the light-blocking layer PHL.

More specifically, the light transmissive areas of the light-blocking layer PHL may be formed by any structure or material that permits light to pass therethrough, such as a plurality of pinholes PIH, which are described in detail herein. The pinholes PIH are optical holes or openings in the light-blocking layer PHL that permit light to pass therethrough. In exemplary embodiments, some of layers of the display device 10 may include the pinholes PIH overlapping each other in a path of reflected light passing through the display panel 110 in a diagonal direction or a vertical direction and then incident on the photosensors PHS.

In an exemplary embodiment, the light-blocking layer PHL may be arranged to correspond to the display area AA. For example, as illustrated in FIG. 1A, the light-blocking layer PHL has a size greater than that of the display area AA, and thus a part of the light-blocking layer PHL may overlap the non-display area NA. However, exemplary embodiments are not limited thereto, and the light-blocking layer PHL may have a size less than or equal to that of the display area AA in other embodiments.

The light-blocking layer PHL may include a conductive material and be electrically coupled to at least one of conductive layers provided in the display panel 110. For example, the light-blocking layer PHL may be electrically coupled to the power line PL provided in the display panel 110. Then, the power (e.g., first power ELVDD) applied to the pixels PXL through the power line PL may be supplied to the light-blocking layer PHL.

In exemplary embodiments, as illustrated in FIG. 1A, when the light-blocking layer PHL overlaps the power line PL in the display area AA, the light-blocking area PHL may be electrically coupled to the power line PL through contact holes in the display area AA. This will be described in detail later with reference to FIGS. 15 to 18.

In exemplary embodiments, one end of the light-blocking layer PHL may include one or more extension parts EP1, EP2, EP3, and EP4 that extend towards the perimeter of the display device 10. For example, the light-blocking layer PHL may have one or more extension parts EP1 and EP2 that extend outwardly, as illustrated in FIG. 1B, from a first end facing the wiring area WA. Alternatively, the light-blocking layer PHL may have one or more extension parts EP3 and EP4 that extend outwardly, as illustrated in FIG. 1C, from a second end opposing the first end facing the wiring area WA. However, exemplary embodiments are not limited thereto, and the light-blocking layer PHL may include only one of the extension parts EP1, EP2, EP3, and EP4 illustrated in FIGS. 1B and 1C, or may include some or all of the extension parts EP1, EP2, EP3, and EP4.

The extension parts EP1, EP2, EP3, and EP4 may be formed to overlap at least one power line PL or to be arranged at least adjacent to the power line PL, and may then be electrically coupled to the power line PL in the non-display area NA. For example, the extension parts EP1, EP2, EP3, and EP4 may be directly coupled to the power line PL, or may be indirectly coupled to the power line PL through a bridge or the like.

The widths of the extension parts EP1, EP2, EP3, and EP4 may be equal to or different from that of the power line PL. When each of the extension parts EP1, EP2, EP3, and EP4 has a width at least similar to a substantially large width of the power line PL, the extension parts EP1, EP2, EP3, and EP4 may be electrically coupled to the power line PL through a plurality of contact holes.

Examples of coupling relationships between the extension part EP1, EP2, EP3, or EP4 and the power line PL will be described in detail later with reference to FIGS. 10A to 12B.

The driving circuit 200 may drive the display panel 110. For example, the driving circuit 200 may output data signals corresponding to image data to the display panel 110 or output driving signals for the photosensors PHS, and may receive sensing signals from the photosensors PHS. The driving circuit 200, having received the sensing signals, may detect the shape of the user's fingerprint using the sensing signals.

In exemplary embodiments, the driving circuit 200 may include a panel driver 210 and a fingerprint detector 220. For convenience of description, although the panel driver 210 and the fingerprint detector 220 are separately illustrated in FIGS. 1A to 1C, exemplary embodiments are not limited thereto. For example, at least a part of the fingerprint detector 220 may be integrated with the panel driver 210, or may be operated in conjunction with the panel driver 210.

The panel driver 210 may supply data signals corresponding to image data to the pixels PXL while sequentially scanning the pixels PXL in the display area AA. Then, the display panel 110 may display an image corresponding to the image data.

In an exemplary embodiment, the panel driver 210 may supply driving signals for fingerprint sensing to the pixels PXL. The driving signals may be provided such that the pixels PXL emit light to function as light sources for the photosensors PHS. In this embodiment, the driving signals for fingerprint sensing may be provided to pixels PXL provided in a specific area in the display panel 110, for example, in the display area AA. In exemplary embodiments, the driving signals for fingerprint sensing may be provided by the fingerprint detector 220.

The fingerprint detector 220 may transfer the driving signals to the photosensors PHS to drive the photosensors PHS, and may detect the user's fingerprint based on the sensing signals received from the photosensors PHS.

Although the pinholes PIH and the photosensors PHS are shown as being arranged in the display area AA in FIGS. 1A to 1C, exemplary embodiments are not limited thereto. For example, at least a part of the display area AA may be set as a sensing area, and the pinholes PIH and the photosensors PHS may be arranged in the sensing area. In this embodiment, the size of the light-blocking layer PHL may be equal to or greater than that of the sensing area. In a case where the size of the light-blocking layer PHL is greater than that of the sensing area, the light-blocking layer PHL may have a size less than or equal to that of the display area AA, or may have a size greater than that of the display area AA, as illustrated in FIGS. 1A to 1C.

Figure 2:
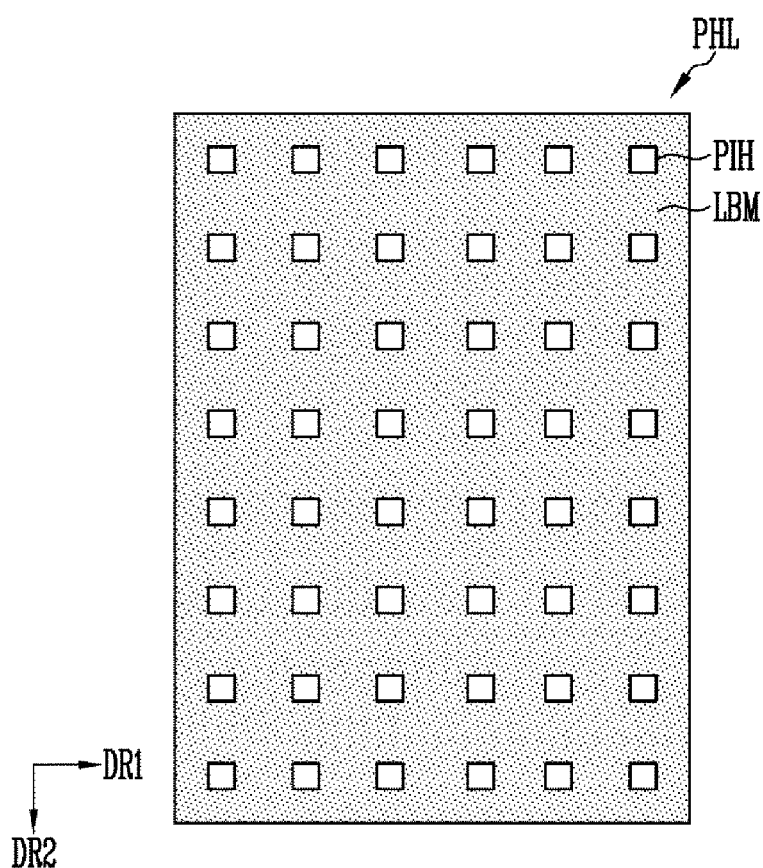
FIG. 2 is a plan view of an exemplary embodiment of a light-blocking layer constructed according to the principles of the invention.

FIG. 2 is a plan view of an exemplary embodiment of a light-blocking layer constructed according to the principles of the invention. In detail, FIG. 2 illustrates a light-blocking layer PHL having a shape illustrated in FIG. 1A. Although not illustrated in FIG. 2, at least one of the extension parts EP1, EP2, EP3, and EP4, illustrated in FIGS. 1B and 1C, may be formed on the light-blocking layer PHL.

Referring to FIG. 2, the light-blocking layer PHL may include a light-blocking mask LBM and a plurality of pinholes PIH distributed over the light-blocking mask LBM.

The light-blocking mask LBM may be formed of a light-blocking and/or light-absorbing material. For example, the light-blocking mast LBM may be formed of an opaque metal layer which is locally opened in an area in which individual pinholes PIH are arranged. However, a material forming the light-blocking mask LBM is not limited to such metal materials, and the light-blocking mask LBM may be formed of various types of materials that are capable of blocking the transmission of light. For example, the light-blocking mask LBM may be formed of a currently known black matrix material.

The pinholes PIH may be optical openings distributed over the light-blocking mask LBM. For example, the pinholes PIH may be empty spaces that are opened in such a way that at least one area of the light-blocking mask LBM is eliminated, and may be through-holes formed through the light-blocking mask LBM. Alternatively, the pinholes PIH may be transparently or semi-transparently formed optical holes so that only part of incident light can be selectively transmitted.

The pinholes PIH may be distributed over the light-blocking mask LBM in a regular or irregular pattern to have a predetermined size and an interval. The pinholes PIH may be formed at a suitable size and a suitable interval to such an extent that a clearer fingerprint shape can be detected while the diffraction of incident light is prevented. For example, the widths of the pinholes PIH may be set to a value that is more than ten times the wavelength of incident light so as to prevent the diffraction of light. Also, an interval between the pinholes PIH may be determined based on distances between the light-blocking layer PHL and the photosensors PHS, the wavelength of incident light, and a field of view (FOV) (or a viewing angle) required for the pinholes PIH.

In the embodiment of FIG. 2, although the pinholes PIH are illustrated as having rectangular shapes, exemplary embodiments are not limited thereto. That is, in exemplary embodiments, the pinholes PIH may have various shapes, such as a rectangular, circular, elliptical, or polygonal shape. However, exemplary embodiments are not limited thereto, and the size, shape, number, resolution and/or array structure of the pinholes PIH may be changed in various manners.

The light-blocking layer PHL may constitute an optical system for selectively transmitting only partial light and blocking the remaining light. Such a light-blocking layer PHL, together with the above-described photosensors PHS, may constitute a fingerprint sensor. Further, the light-blocking layer PHL may be integrated with a circuit-element layer of the display panel 110. In this case, the module thickness of the display device equipped with the photo-sensing-type fingerprint sensor may be reduced or minimized.

FIGS. 3A to 3D are plan views of exemplary embodiments of an array structure of pixels, pinholes, and photosensors constructed according to the principles of the invention. In detail, FIGS. 3A to 3D illustrate different embodiments related to the relative sizes, resolution, and/or array relationships of pixels PXL, pinholes PIH, and photosensors PHS arranged in the display area AA of FIGS. 1A to 1C.

Figure 3A:
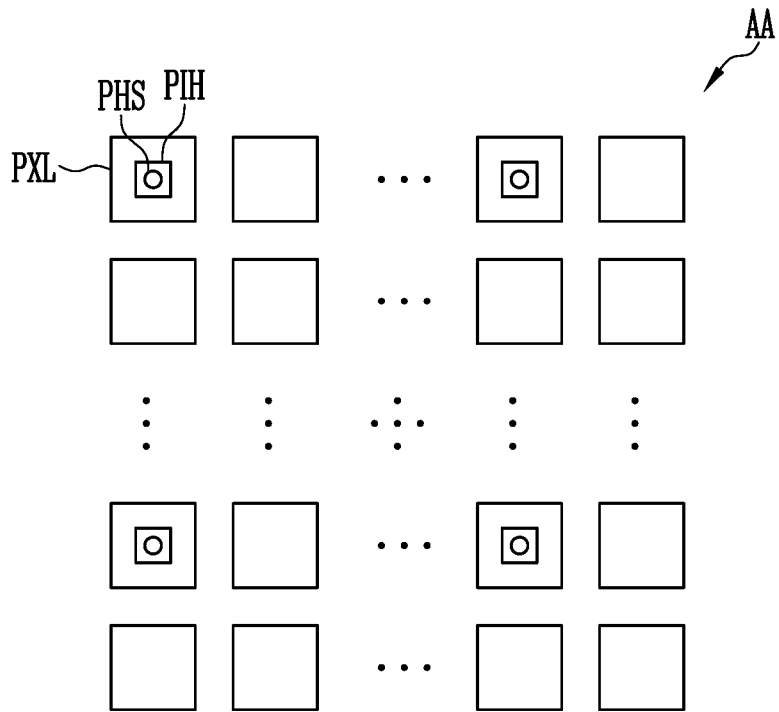
FIGS. 3A to 3D are plan views of exemplary embodiments of an array structure of pixels, pinholes, and photosensors constructed according to the principles of the invention.

Referring to FIG. 3A, the display area AA may include a number of pinholes PIH and photosensors PHS less than the number of pixels PXL. For example, the pinholes PIH and the photosensors PHS may have sizes smaller than those of the pixels PXL, and may be distributed over the display area AA at resolution lower than that of the pixels PXL.

Although a smaller number of pinholes PIH and photosensors PHS than the number of pixels PXL are shown in FIG. 3A, exemplary embodiments are not limited thereto. For example, in other exemplary embodiments, the numbers of pinholes PIH and photosensors PHS distributed over the display area AA are substantially equal to each other and the interval between the pinholes PIH and the interval between the photosensors PHS are substantially equal to each other so that the pinholes PIH and the photosensors PHS are arranged in one to one correspondence. For example, the pinholes PIH and the photosensors PHS may be arranged to overlap each other while forming respective pairs in one-to-one correspondence. In an exemplary embodiment, one pair of a pinhole PIH and a photosensor PHS may be arranged to overlap any one pixel PXL arranged in the display area AA, but exemplary embodiments are not limited thereto. For example, the pinholes PIH and the photosensors PHS may be alternately arranged not to overlap each other, or may be arranged not to overlap the pixels PXL.

The pinholes PIH and the photosensors PHS may have equal or different sizes. That is, the relative sizes or resolutions of the pinholes PIH and the photosensors PHS are not especially limited to specific values.

Figure 3B:
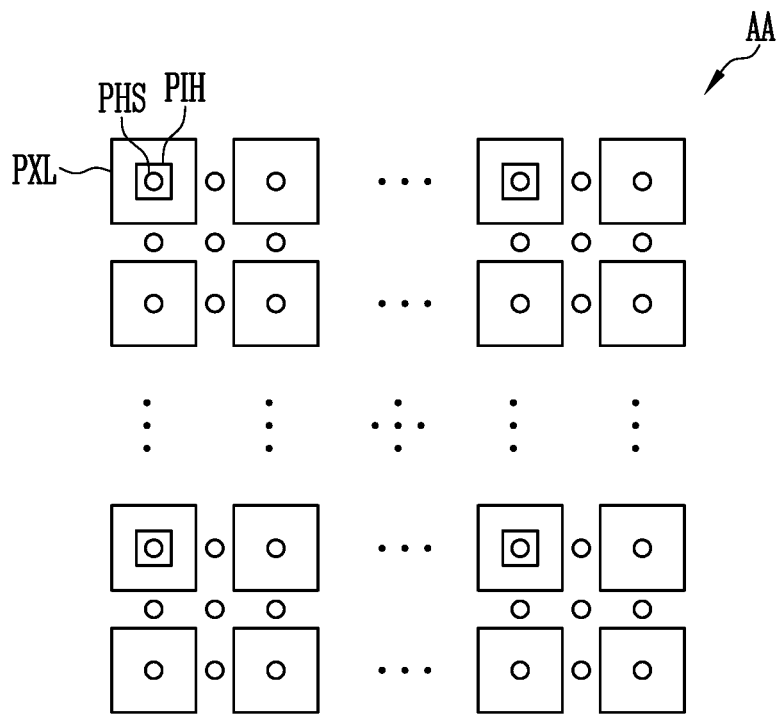

Referring to FIG. 3B, the display area AA may include a number of pinholes PIH less than the number of pixels PXL and a number of photosensors PHS greater than the number of pixels PXL. For example, the pinholes PIH and the photosensors PHS may have sizes smaller than those of the pixels PXL, but the pinholes PIH may be distributed over the display area AA at a resolution lower than that of the pixels PXL, and the photosensors PHS may be densely distributed over the display area AA at a resolution higher than that of the pixels PXL.

At least some of the photosensors PHS may overlap any one pinhole PIH and/or any one pixel PXL, but exemplary embodiments are not limited thereto. For example, some of the photosensors PHS may be arranged to overlap the pinholes PIH and/or pixels PXL, and others may be arranged in a gap between the pixels PXL.

Figure 3C:
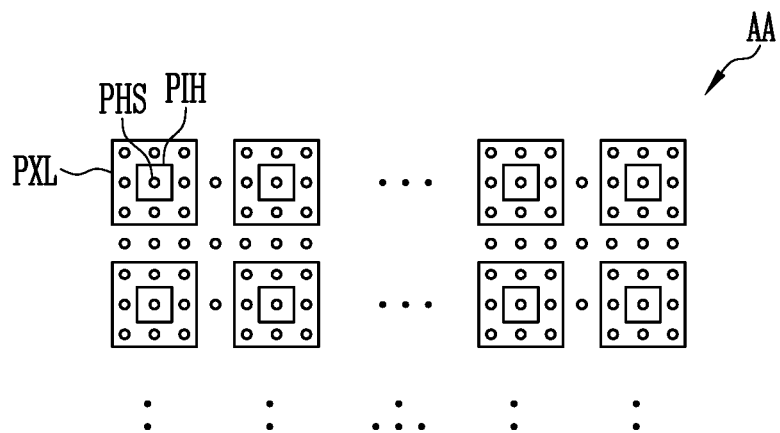
Figure 3D:
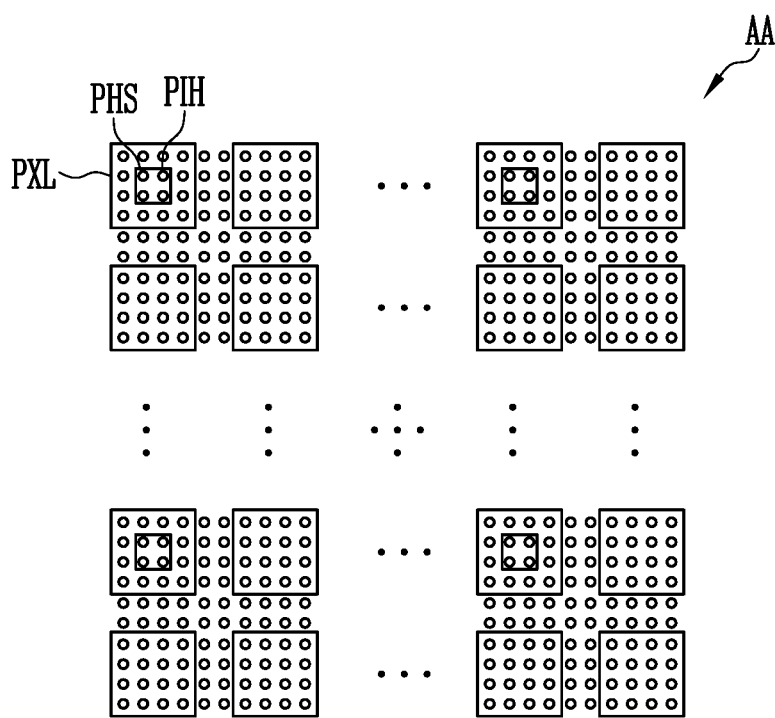

Referring to FIGS. 3C and 3D, photosensors PHS may be distributed over the display area AA so that they have a smaller size and a higher resolution than those in the embodiment of FIG. 3B. For example, the photosensors PHS may be distributed over the display area AA at an shorter interval (e.g., an interval of 50 μm in each of horizontal and vertical directions) that is about ¹⁄₁₀ to ¹⁄₁₀₀ of the interval between the pinholes PIH (e.g., an interval of 450 μm in each of horizontal and vertical directions), and may be densely distributed over the display area AA at a resolution higher than that of the pixels PXL. In this case, the photosensors PHS may be densely arranged in the display area AA to such an extent that one-to-one correspondence is not required between the pixels PXL and/or between the pinholes PIH, and thus a Moire phenomenon may be prevented or minimized regardless of whether the pixels PXL and/or the pinholes PIH and the photosensors PHS are aligned with each other.

The pinholes PIH may be distributed over the display area AA at a resolution identical to or different from that of the pixels PXL. For example, the pinholes PIH may be distributed over the display area AA at a density identical to that of the pixels PXL, as illustrated in FIG. 3C, or may be distributed over the display area AA at a density less than that of the pixels PXL, as illustrated in FIG. 3D.

In FIGS. 3A to 3D, the embodiments in which the pinholes PIH and the photosensors PHS are arranged in a regular array form in the display area AA have been illustrated, but exemplary embodiments are not limited thereto. That is, the pinholes PIH and/or the photosensors PHS may be irregularly scattered over the display area AA, or may be distributed at different densities or array structures depending on each region or each section of the display area AA.

The array structures of the pixels PXL, the pinholes PIH, and the photosensors PHS are not limited to the embodiments illustrated in FIGS. 3A to 3D. For example, the shapes, array forms, relative sizes, numbers, resolutions and/or mutual arrangement relationships of the pixels PXL, pinholes PIH, and/or photosensors PHS arranged in the display area AA may be changed in various manners.

Figure 4:
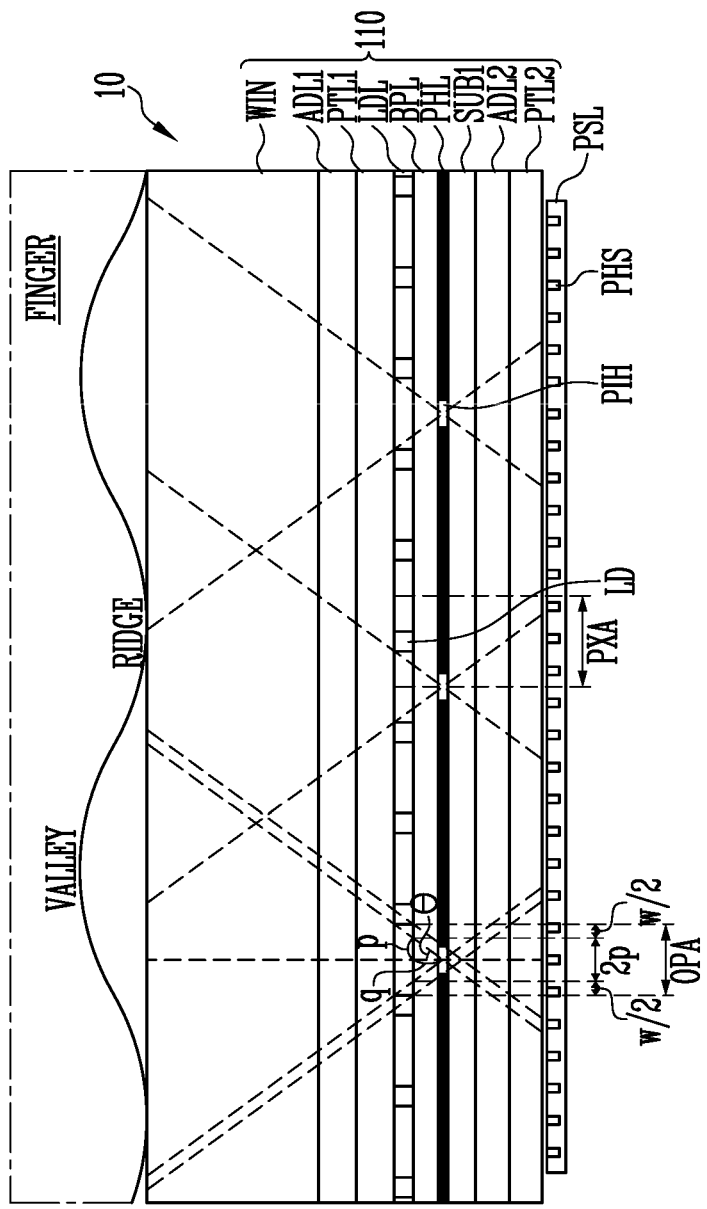
FIG. 4 is a cross-sectional view of an exemplary embodiment of a display device constructed according to the principles of the invention.

FIG. 4 is a cross-sectional view of an exemplary embodiment of a display device constructed according to the principles of the invention.

Referring to FIG. 4, a display device 10 may include a display panel 110 and a sensor layer PSL arranged on one surface of the display panel 110.

The display panel 110 may be operable to display an image. The type of the display panel 110 is not especially limited to a specific type so long as the display panel 110 can display an image. The display panel 110 may be a self-emissive display panel, such as an organic light-emitting diode (OLED) display panel. Also, the display panel 110 may be a non-emissive display panel, such as a liquid crystal display (LCD) panel, an electrophoretic display (EPD) panel, or an electrowetting display (EWD) panel. When the display panel 110 is configured as the non-emissive display panel, the display device 10 may be provided with a backlight component for supplying light to the display panel 110.

The display panel 110 may include a first substrate SUB1, and a circuit-element layer BPL, a light-emitting element layer LDL, a first protective layer PTL1, a first adhesive layer ADL1, and a window WIN, which are sequentially disposed on a first surface (e.g., a top surface) of the first substrate SUB1. Further, the display device 10 may include a second adhesive layer ADL2 and a second protective layer PTL2, which are sequentially disposed on a second surface (e.g., a bottom surface) of the first substrate SUB1.

The first substrate SUB1, which is a base material of the display panel 110, may substantially be a transparent light-transmissive substrate. The first substrate SUB1 may be either a rigid substrate including glass or reinforced glass, or a flexible substrate made of a plastic material. However, the material of the first substrate SUB1 is not limited thereto, and the first substrate SUB1 may be made of various materials.

The first substrate SUB1 may include a display area AA and a non-display area NA, such as those illustrated in FIGS. 1A to 1C. Further, the display area AA may include a plurality of pixel areas PXA in which respective pixels PXL are arranged and/or formed.

The circuit-element layer BPL may be arranged on the first surface of the first substrate SUB1, and may include at least one conductive layer. For example, the circuit-element layer BPL may include a plurality of circuit elements constituting the pixel circuits of the pixels PXL and lines for supplying various types of power and signals required in order to drive the pixels PXL. In this case, the circuit-element layer BPL may include a plurality of conductive layers for forming various types of circuit elements, such as at least one transistor and at least one capacitor, and lines coupled to the circuit elements. Also, the circuit-element layer BPL may include at least one insulating layer provided between the plurality of conductive layers. Furthermore, the circuit-element layer BPL may include a wiring unit which is arranged in the non-display area NA of the first substrate SUB1 to supply power and signals corresponding to the lines coupled to the pixels PXL.

The light-emitting element layer LDL may be disposed on a first surface of the circuit-element layer BPL. The light-emitting element layer LDL may include a plurality of light-emitting elements LD coupled to the circuit elements and/or lines of the circuit-element layer BPL through contact holes or the like. The light-emitting elements LD may be organic light-emitting diodes or micro-sized light-emitting elements that use the structure of inorganic crystal growth. In an exemplary embodiment, at least one of the plurality of light-emitting elements LD may be arranged in each pixel area PXA.

Each of the pixels PXL may include circuit elements disposed in the circuit-element layer BPL and at least one light-emitting element LD disposed in the light-emitting element layer LDL on the top of the circuit-element layer BPL. The structure of each pixel PXL will be described in detail later.

The first protective layer PTL1 may be disposed on the top of the light-emitting element layer LDL to cover the display area AA. The first protective layer PTL1 may include a sealing element, such as a thin-film encapsulation (TFE) layer or an encapsulation substrate, and may additionally include a protective film or the like in addition to the sealing element.

The first adhesive layer ADL1 may be interposed between the first protective layer PTL1 and the window WIN to couple the first protective layer PTL1 to the window WIN. The first adhesive layer ADL1 may contain a transparent adhesive, such as an optical clear adhesive (OCA), and may additionally contain various types of adhesive materials.

The window WIN may be a protective element disposed in an uppermost portion of the module of the display device 10 including the display panel 110, and may be an actually transparent light-transmissive substrate. Such a window WIN may have a multilayer structure selected from among a glass substrate, a plastic film, and a plastic substrate. The window WIN may include a rigid or flexible material, and the material forming the window WIN is not especially limited.

In exemplary embodiments, the display device 10 may further include a polarizing plate and/or a touch sensor layer (touch electrode layer). For example, the display device 10 may further include a polarizing plate and/or a touch sensor layer, which are interposed between the first protective layer PTL1 and the window WIN.

The second protective layer PTL2 may be arranged on a second surface of the first substrate SUB1. The second protective layer PTL2 may be coupled to the first substrate SUB1 through the second adhesive layer ADL2.

The second adhesive layer ADL2 may firmly couple (or attach) the first substrate SUB1 and the second protective layer PTL2 to each other. The second adhesive layer ADL2 may contain a transparent adhesive, such as OCA. The second adhesive layer ADL2 may contain a pressure sensitive adhesive (PSA) on which an adhesive material acts when pressure for bonding the second adhesive layer ADL2 to an adhered end is applied. When the second adhesive layer ADL2 contains a pressure sensitive adhesive, the second adhesive layer ADL2 may be attached to the adhered end using only pressure without requiring separate heat treatment or UV treatment.

In an exemplary embodiment, the second adhesive layer ADL2 may contain a material which absorbs specific wavelengths of light or a material which blocks the specific wavelengths of light. For example, the second adhesive layer ADL2 may contain an infrared-absorbing material which absorbs infrared light having high energy density, or an infrared-shielding material which blocks the infrared light.

The infrared-absorbing material may include an inorganic oxide containing Antimon-Tin Oxide (ATO), Indium Tin Oxide (ITO), tungsten oxide, or carbon black, and a metal material, such as Ag. The inorganic oxide may selectively transmit light in a visible light band, and may absorb infrared light. Further, the infrared-absorbing material may include, for example, organic dyes. The organic dyes may be dyes used for, for example, color filters provided in the display panel 110.

The infrared-shielding material may include one or more selected from the group consisting of, for example, a borate mixture, a carbonate mixture, an aluminate mixture, a nitrate mixture, a nitrite mixture, lithium borate, sodium borate, potassium borate, magnesium borate, calcium borate, strontium borate, barium borate, Na2B4Ox, colemanite, lithium carbonate, sodium carbonate, potassium carbonate, calcium carbonate, calcite, CaCO3, dolomite, and magnesite. Also, the infrared-shielding material may be at least one of one or more types of dyes selected from the group consisting of nickel dithiol, dithiol metal complex, cyanin, squarylium, croconium, diimmonium, Aminium, ammonium, phthalocyanine, naphthalocyanine, anthraquinone, naphthoquinone, condensation polymer azo-based pyrrole, polymethine, and propylene-based compounds.

When the user's finger reaches (or is positioned on) the display surface (e.g., a surface on which an image is displayed) of the display device 10, the display device 10 may perform a function of sensing the user's fingerprint through photosensors PHS, which will be described later. When external light flows into the display device 10 while the user's fingerprint is sensed, a visible light band of the external light may be blocked by the user's hand, but infrared light may pass through the user's hand, and may then be incident on the photosensors PHS. The infrared light incident on the photosensors PHS may act as noise, thus decreasing the accuracy of recognition of light reflected from the user's hand.

As in the illustrated embodiment, when the second adhesive layer ADL2 contains an infrared-absorbing material and/or an infrared-shielding material, the infrared light of the external light is absorbed and/or blocked by the second adhesive layer ADL2 and is not incident on the photosensors PHS even if the infrared light of the external light passes through the user's hand, thus improving the accuracy of fingerprint recognition.

The second protective layer PTL2 may prevent a penetration of oxygen and moisture from the outside, and may be provided in a single-layer form or a multilayer form. The second protective layer PTL2 may be formed in the shape of a film, and may further secure the flexibility of the display panel 110. The second protective layer PTL2 may be coupled to the sensor layer PSL through an additional adhesive layer which contains a transparent adhesive, such as OCA.

In exemplary embodiments, a selective light-shielding film may be further provided on the bottom of the second protective layer PTL2. The selective light-shielding film may block a specific frequency (or wavelength) band contained in external light flowing into the display device 10, for example, an infrared light band, thus preventing the corresponding infrared light from being incident on the photosensors PHS of the sensor layer PSL. Although the selective light-shielding film is described as being further provided on the bottom of the second protective layer PTL2, exemplary embodiments are not limited thereto. For example, as long as the selective light-shielding film may be arranged on the top of the sensor layer PSL, the light-shielding film may be freely provided on any layer of the display device 10. Also, the selective light-shielding film may be omitted when a component for blocking infrared light such as the second adhesive layer ADL2 is included in the display panel 110.

The light-blocking layer PHL may be interposed between the light-emitting element layer LDL and the sensor layer PSL. For example, the light-blocking layer PHL may be interposed between the first substrate SUB1 and the circuit-element layer BPL, as illustrated in FIG. 4. The light-blocking layer PHL may include a plurality of pinholes PIH, as described above with reference to FIG. 2.

The display panel 110 may be transparently formed in an area in which the pinholes PIH are disposed so that light reflected from the fingerprint or the like of the finger can pass through individual pinholes PIH. Also, the display panel 110 may be configured such that light satisfying a field of view (FOV) (or also referred to as a "viewing angle") falling within a predetermined angular range can pass through individual pinholes PIH in order to reduce the loss of reflected light required for fingerprint sensing.

For example, the display panel 110 may be transparently formed in a region overlapping each pinhole PIH while having an area larger than the pinhole PIH. Hereinafter, the region transparently formed to enable reflected light to pass therethrough is referred to as an "optical aperture (OPA)".

Assuming that, with respect to the center of each pinhole PIH, the field of view (FOV) falling within a desired range is $\theta$, the thickness of the circuit-element layer BPL is q, and the width of the optical aperture OPA formed at an interface between the circuit-element layer BPL and the light-emitting element layer LDL is 2p, $2p=2\times(q\times\tan\theta)$ may be satisfied. In an exemplary embodiment, the field of view may fall within an angular range from about 30° to 60°, but is not limited thereto.

The pinholes PIH may have a predetermined width w, e.g., a width w ranging from 5 μm to 20 μm, and the width of the optical aperture OPA may be 2p+w. In this way, in a direction farther away from the light-blocking layer PHL (i.e., a direction towards the top and bottom of the light-blocking layer PHL), the width of the optical aperture OPA to be secured by each layer of the display device 10 may gradually increase.

The width w (or diameter) of the pinholes PIH may be set to a value that is about more than ten times as large as the wavelength of reflected light, for example, 4 μm or 5 μm or more so that diffraction of light can be prevented. Further, the width w of the pinholes PIH may be set to a size sufficient to prevent an image blur and to more clearly sense the shape of the fingerprint. For example, the width w of the pinholes PIE may be set to a value less than or equal to about 15 μm. However, exemplary embodiments are not limited thereto, and the width w of the pinholes PIE may vary depending on the wavelength band of reflected light and/or the thickness of each layer of the module.

An interval (or a pitch) between adjacent pinholes PIE may be set in consideration of the distance between the light-blocking layer PHL and the sensor layer PSL and the wavelength range of reflected light. For example, when the FOV of reflected light desired to be secured is about 45°, the interval between adjacent pinholes PIH may be set to a value that is twice or more the distance between the light-blocking layer PHL and the sensor layer PSL, and may also be set to a value that is equal to or greater than a value obtained by adding a predetermined error range to the distance. In this case, images observed by respective photosensors PHS may be prevented from overlapping each other, and thus image blur may be prevented.

The sensor layer PSL may be attached to the second surface (e.g., a rear surface) of the display panel 110 to overlap at least one region of the display panel 110. The sensor layer PSL may be arranged to overlap the display panel 110 in at least the display area AA. Such a sensor layer PSL may include a plurality of photosensors PHS that are distributed at a predetermined resolution and/or at a predetermined interval. The intervals between the photosensors PHS may be densely set such that light reflected from an observation target (e.g., a specific area of a finger, such as a fingerprint area) is incident on at least two neighboring photosensors PHS.

The photosensors PHS of the sensor layer PSL may output an electrical signal, corresponding to the reflected light received after passing through the pinholes PIH, as a sensing signal. Reflected light components received by respective photosensors PHS may have different optical characteristics (e.g., frequency, wavelength, intensity, etc.) depending on whether the corresponding reflected light is generated due to the valley or ridge of the fingerprint formed on the user's finger). Therefore, the photosensors PHS may output sensing signals having different electrical characteristics in accordance with the optical characteristics of respective reflected light components. The sensing signals output from the photosensors PHS may be converted into image data, and may be used to identify the user's fingerprint.

As described above, the display device 10 may include a fingerprint sensor including the light-emitting element layer LDL, the sensor layer PSL, and the light-blocking layer PHL. The light-emitting element layer LDL may include light-emitting elements LD that are capable of also functioning as the light sources of photo-sensing-type sensors. The sensor layer PSL may include photosensors PHS which receive light reflected from an object (e.g., a fingerprint area of the finger) located on the top of the display device 10 after being emitted from the light-emitting element layer LDL.

The light-blocking layer PHL disposed between the light-emitting element layer LDL and the sensor layer PSL may include pinholes PIH to selectively transmit the reflected light.

The display device 10 may utilize the light-emitting elements LD of the pixels PXL as light sources of the fingerprint sensor, but exemplary embodiments are not limited thereto. For example, the display device may include a separate light source for fingerprint sensing.

A fingerprint sensing method using the display device 10 according to the illustrated embodiment will be described in brief below. During a fingerprint sensing period in which the photosensors PHS are activated, pixels PXL in the display area AA (in particular, light-emitting elements LD provided in the pixels PXL) may emit light in a state in which a user brings his or her finger (e.g., a fingerprint area) into contact with the display area AA or moves the finger closer to the display area AA. For example, during the fingerprint sensing period, all pixels PXL in the display area AA may simultaneously or sequentially emit light. Alternatively, among the pixels PXL in the display area AA, only some pixels PXL may emit light at predetermined intervals, or alternatively, only some pixels PXL for emitting light in a specific color (e.g., light having a short wavelength, such as blue light) may selectively emit light.

Part of the light emitted from the pixels PXL may be incident on the photosensors PHS after being reflected from the user's finger and passing through the optical aperture OPA and pinholes PIH formed in each layer of the display device 10. Here, the shape (fingerprint pattern) of the user's fingerprint may be detected based on the difference between the quantities of light reflected from the ridges and valleys of the fingerprint and/or the waveforms of the reflected light.

Figure 5:
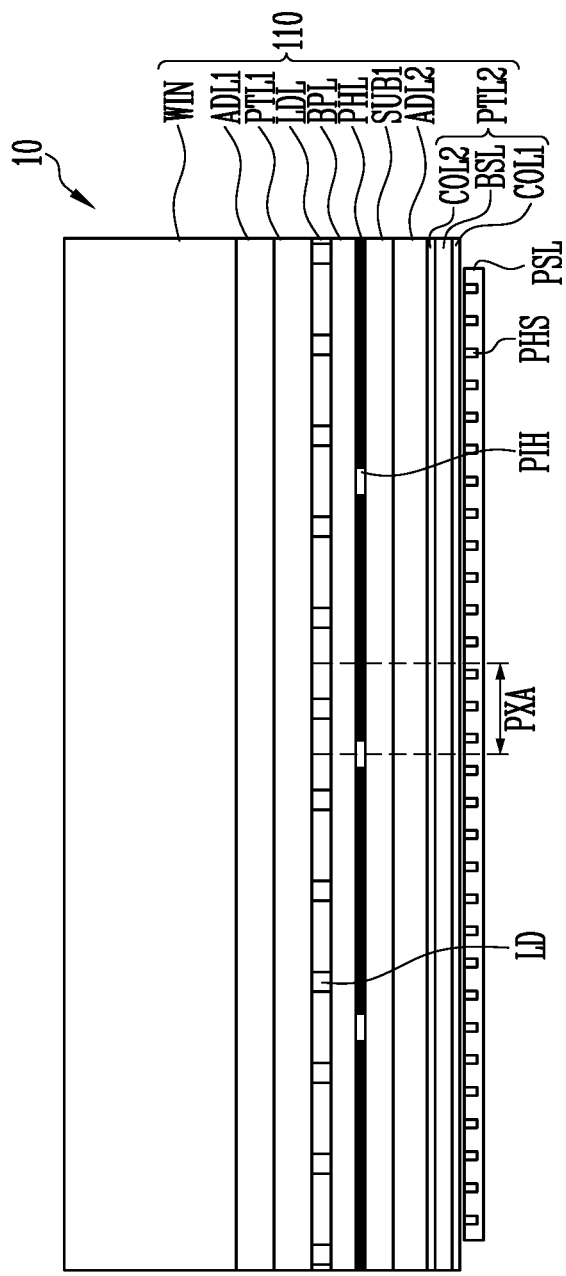
FIG. 5 is a cross-sectional view of another exemplary embodiment of a display device constructed according to the principles of the invention.

FIG. 5 is a cross-sectional view of another exemplary embodiment of a display device constructed according to the principles of the invention. Detailed description of components identical or similar to those of FIG. 4 will be omitted to avoid redundancy.

Referring to FIG. 5, a display panel 110 may include a second protective layer PTL2. The second protective layer PTL2 may include a base layer BSL and a first coating layer COL1 and a second coating layer COL2 respectively formed on a bottom surface and a top surface of the base layer BSL.

The base layer BSL may be implemented in the form of a plastic film including at least one organic layer. The plastic film may be manufactured to include at least one of, for example, a thermoplastic polymer resin, such as polyimide (PI), polyethersulfone (PES), polyarylate (PAR), polyethylene naphthalate (PEN), polyethylene terephthalate (PET), or cycloolefin copolymer, polycarbonate (PC), and like having high transparency and excellent heat-dissipation performance, and a thermosetting polymer resin, such as epoxy, unsaturated polyesters, phenol (PF), silicone, or polyurethane.

In an exemplary embodiment, the material of the base layer BSL is not limited to the above examples. As the material of the base layer BSL, a suitable material may be selected from among materials capable of protecting layers disposed on the top the base layer BSL depending on the design condition or the like of the display panel 110. In an exemplary embodiment, the base layer BSL may also include the same materials as the infrared-absorbing material and/or infrared-shielding material included in the second adhesive layer ADL2 of the display device 10.

Any one of the first and second coating layers COL1 and COL2 may be coated with an infrared-shielding material that reflects and blocks infrared light, and the remaining one may be coated with an infrared-absorbing material that absorbs infrared light. For example, the first coating layer COL1 may be a layer on which a mixture mixed with a material which absorbs infrared light is applied (or coated), and the second coating layer COL2 may be a layer on which a mixture mixed with a material which reflects and blocks the infrared light is applied (or coated). For example, the material which reflects and blocks the infrared light may include, but is not limited to, Titanium Oxide ($TiO_2$) or Magnesium Fluoride ($MgF_2$).

As described above, when the second protective layer PTL2 includes the infrared-shielding material which reflects and/or blocks infrared light and the infrared-absorbing material which absorbs infrared light, infrared light is not incident on the sensor layer PSL by means of the second protective layer PTL2 located on the top of the sensor layer PSL even if infrared light of external light passes through the user's hand. Accordingly, the photosensors PHS may more accurately recognize the user's fingerprint without interference of external light.

In an exemplary embodiment, some components of the display panel 110, for example, the second adhesive layer ADL2 and/or the second protective layer PTL2, are configured to include the infrared-absorbing material and/or the infrared-shielding material, without additionally requiring a separate component such as an infrared-shielding film, thus blocking infrared light. Accordingly, manufacturing costs for the display device 10 may be decreased, and the thickness of the display device 10 may be further reduced.

FIGS. 6 to 9 are cross-sectional views of still other exemplary embodiments of a display device constructed according to the principles of the invention. Detailed description of components identical or similar to those of FIG. 4 will be omitted to avoid redundancy.

Figure 6:
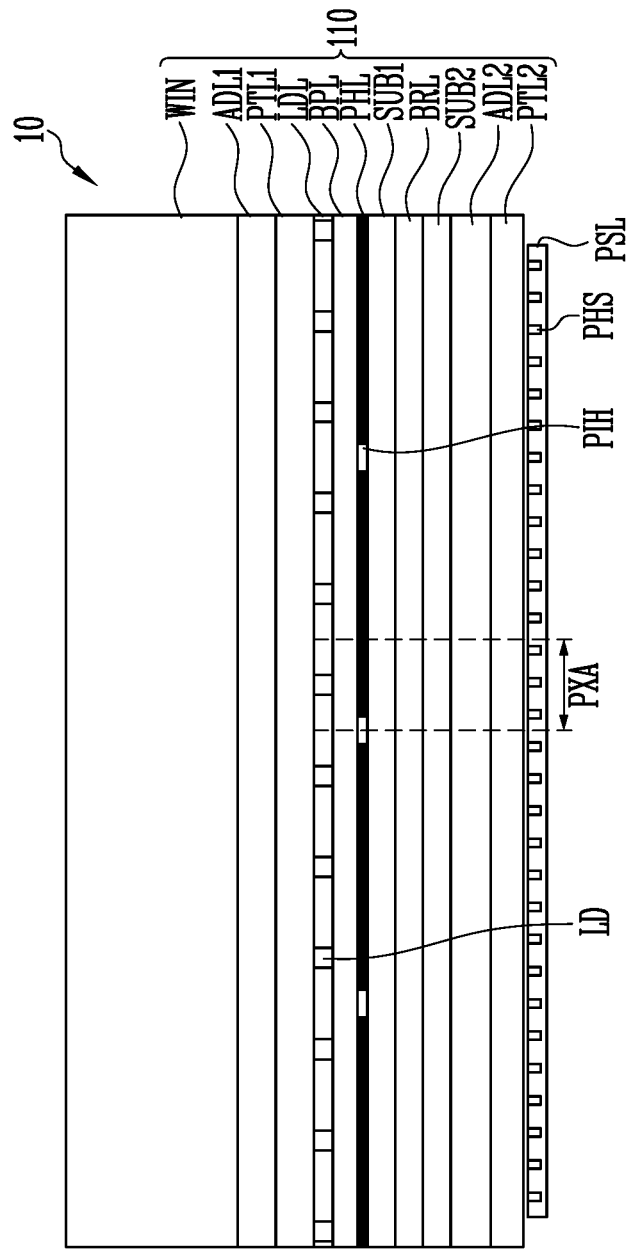
FIGS. 6 to 9 are cross-sectional views of still other exemplary embodiments of a display device constructed according to the principles of the invention.

Referring to FIG. 6, a display panel 110 may further include a second substrate SUB2 arranged on a first surface (e.g., a bottom surface) of a first substrate SUB1. The second substrate SUB2 may be interposed between the first substrate SUB1 and a sensor layer PSL. In this embodiment, a barrier layer BRL may be disposed between the first substrate SUB1 and the second substrate SUB2.

The second substrate SUB2 may be formed of a material identical to or different from that of the first substrate SUB1. For example, the first substrate SUB1 and the second substrate SUB2 may be thin-film substrates, each made of a polyimide (PI) material. Alternatively, the first substrate SUB1 and the second substrate SUB2 may be heterogeneous substrates having different materials. Such a second substrate SUB2 may include at least one of materials described as the components of the first substrate SUB1, and may be formed to additionally include various types of materials.

The barrier layer BRL may be provided in the form of a single-layer structure or a multilayer structure. For example, the barrier layer BRL may be formed as a structure in which at least 10 inorganic insulating layers are stacked.

Figure 7:
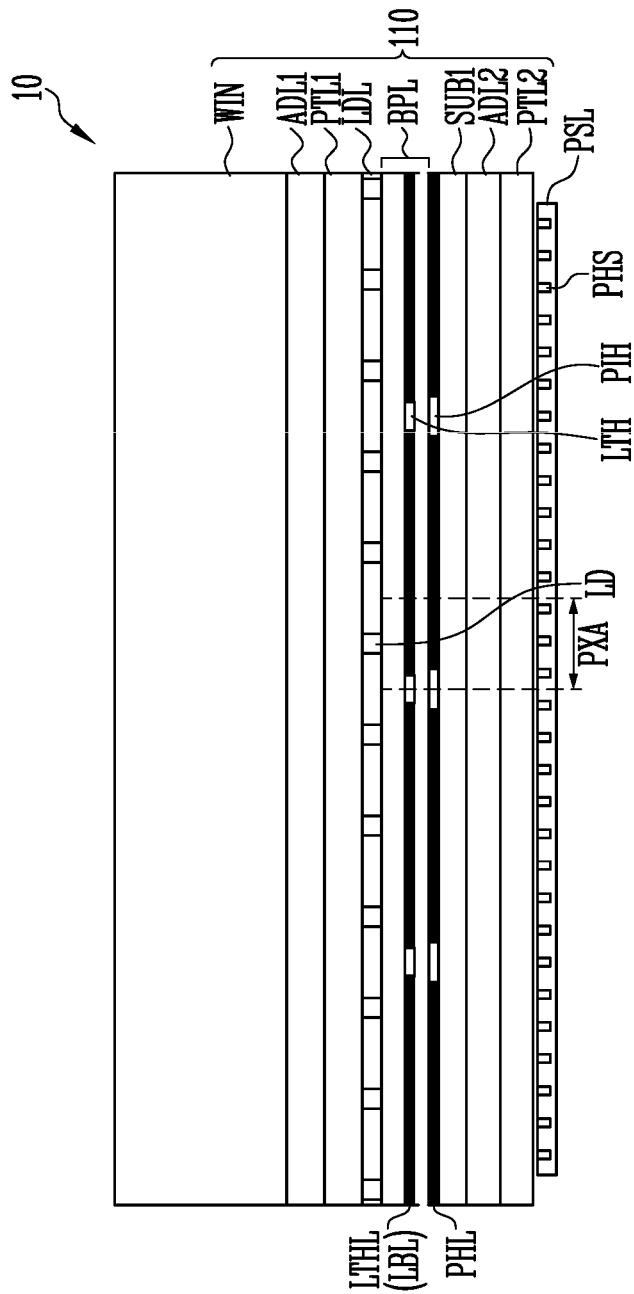
Figure 8:
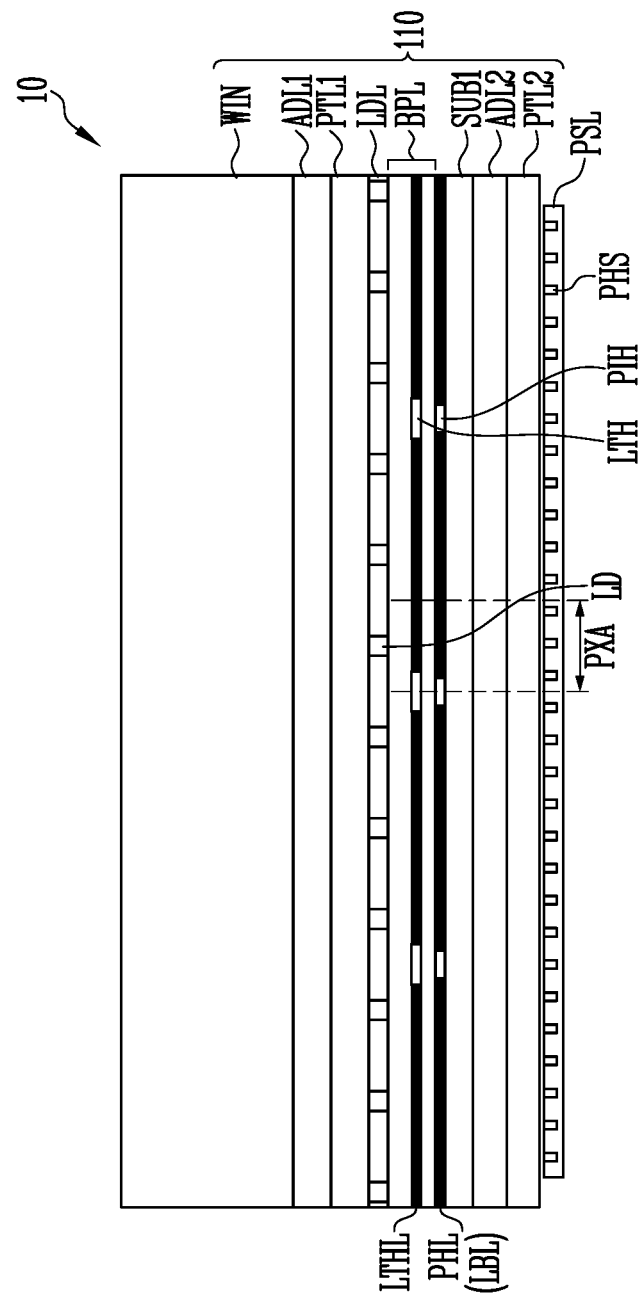

Referring to FIGS. 7 and 8, a circuit-element layer BPL may include a light-transmitting layer LTHL including a plurality of light transmission holes LTH. Also, a light-blocking layer PHL including a plurality of pinholes PIH may be interposed between the first substrate SUB1 and the circuit-element layer BPL. Each light transmission hole LTH and each pinhole PIH may be arranged to at least partially overlap each other.

The exemplary embodiments, the light transmission holes LTH and the pinholes PIH may have identical or different sizes. For example, the light transmission holes LTH may have a width (or a diameter) smaller than that of the pinholes PIH, as illustrated in FIG. 7. For example, the pinholes PIH and the light transmission holes LTH may have widths (or diameters) ranging from 5 μm to 20 μm, and the light transmission holes LTH may each have a width (or a diameter) less than that of the pinholes PIH.

In case where the light transmission holes LTH have a size less than that of the pinholes PIH, the light-transmitting layer LTHL may perform a function of a light control layer (LBL) function of controlling an optical path (e.g., a function of limiting the field of view of reflected light to a predetermined angular range), and the light-blocking layer PHL may perform a light-blocking function selectively transmitting the light.

The light transmission holes LTH may have a width (or a diameter) greater than that of the pinholes PIH, as illustrated in FIG. 8. In this embodiment, the light-transmitting layer LTHL may perform a light-blocking function, and the light-blocking layer PHL may perform a function of the light control layer LBL for controlling an optical path.

Figure 9:
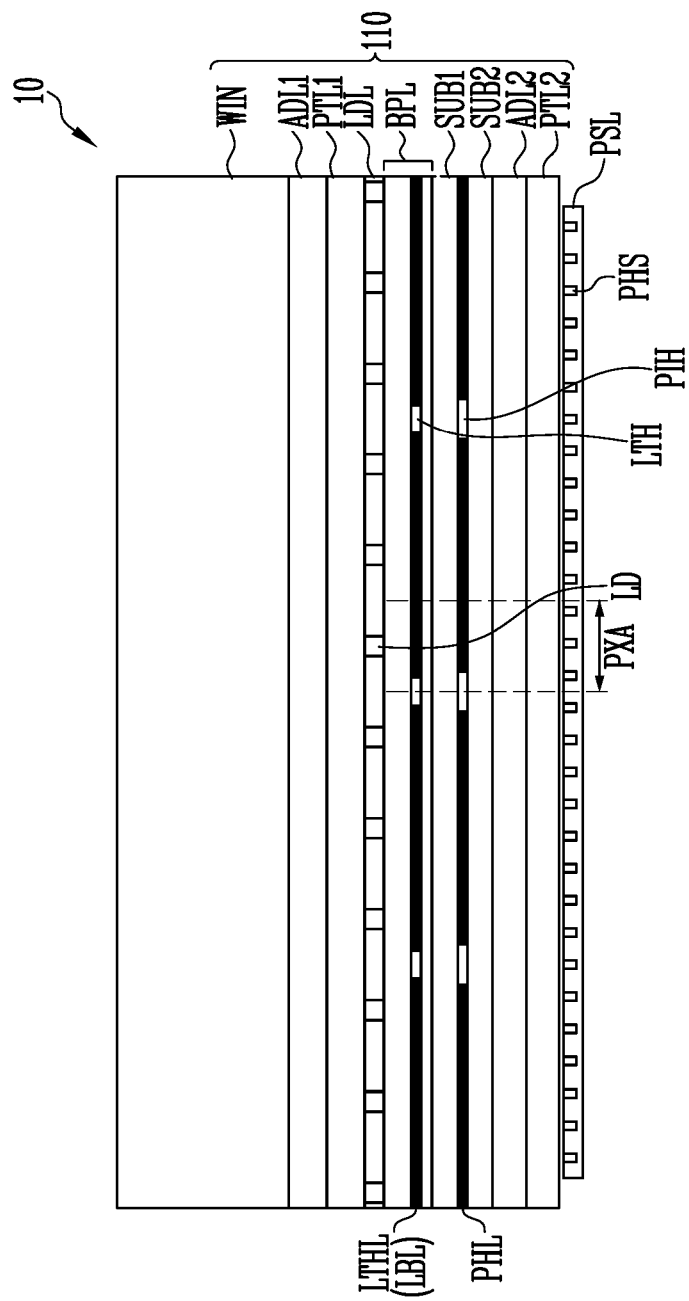

Referring to FIG. 9, the circuit-element layer BPL may include a light-transmitting layer LTHL including a plurality of light transmission holes LTH. A second substrate SUB2 may further be provided as described with reference to FIG. 6, and a light-blocking layer PHL including a plurality of pinholes PIH may be interposed between the first substrate SUB1 and the second substrate SUB2.

In exemplary embodiments, the light transmission holes LTH and the pinholes PIH may have identical or different sizes. For example, the light transmission holes LTH may have a width (or a diameter) smaller than that of the pinholes PIH. In this embodiment, the light-transmitting layer LTHL may perform a function of the light control layer LBL for controlling an optical path, and the light-blocking layer PHL may perform a light-blocking function selectively transmitting the light.

As described above, when the light transmission holes LTH are extensively formed over a wide area in the circuit-element layer BPL of the display panel 110, a load acting on lines formed on the circuit-element layer BPL, for example, scan lines, data lines, etc., may be increased. Such an increase in the load may increase power consumption of the display device 10. In addition, when the light transmission holes LTH are extensively formed over a wide area in the circuit-element layer BPL of the display panel 110, crosstalk with elements, e.g., transistors, of respective pixels PXL occurs, thus deteriorating the quality of the display panel 110.

These problems may be solved by applying power to the light-blocking layer PHL arranged adjacent to the circuit-element layer BPL and by inducing the characteristics of adjacent transistors to vary depending on the electric field effect of the light-blocking layer PHL. Hereinafter, this aspect of the disclosure will be described in detail.

Figure 10A:
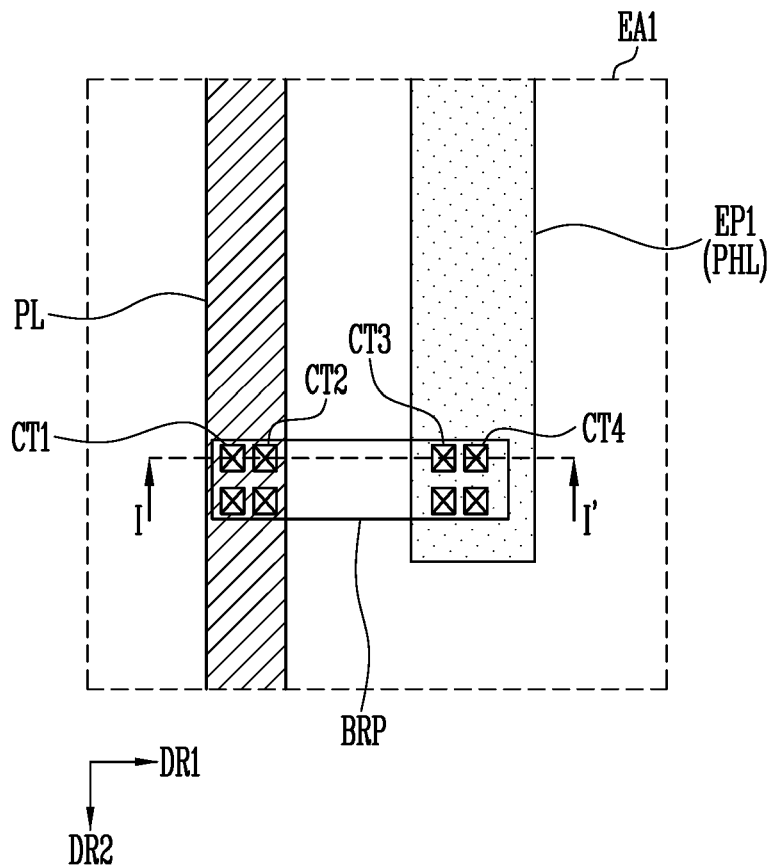
FIG. 10A is an enlarged plan view of an exemplary embodiment of portion EA1 of FIG. 1B.
Figure 10B:
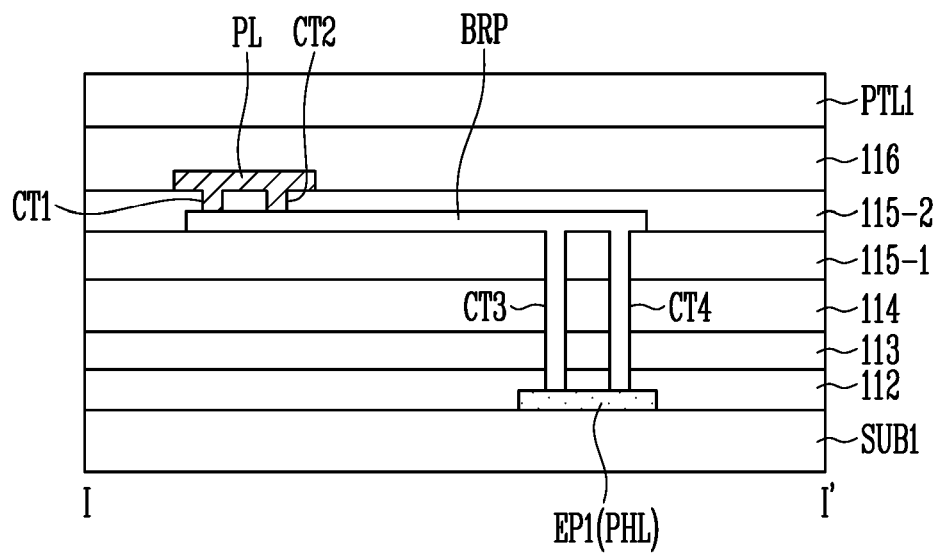
FIG. 10B is a cross-sectional view taken along line I-I' of FIG. 10A.

FIG. 10A is an enlarged plan view of an exemplary embodiment of portion EA1 of FIG. 1B. FIG. 10B is a cross-sectional view taken along line I-I' of FIG. 10A. In FIGS. 10A and 10B, only some of components included in the non-display area NA are schematically illustrated in order to more easily explain coupling relationships between the light-blocking layer PHL and the power line PL.

In FIGS. 10A and 10B, although coupling relationships with the power line PL will be described using a first extension part EP1, among extension parts EP1, EP2, EP3, and EP4 of the light-blocking layer PHL illustrated in FIGS. 1B and 1C, by way of example, the following embodiment may be equally applied to the second to fourth extension parts EP2, EP3, and EP4 and the power line PL adjacent thereto.

The first substrate SUB1 may be partitioned into a display area AA and a non-display area NA, and pixels PXL may be arranged in the display area AA. The non-display area NA may include a wiring area WA in which the power line PL is arranged.

Referring to FIGS. 10A and 10B, in the display device 10, a first substrate SUB1, and a buffer layer 112, a gate insulating layer 113, first to third interlayer insulating layers 114, 115-1, and 115-2, and a protective layer 116, which are sequentially stacked on the first substrate SUB1, may be provided.

The first substrate SUB1, which is a base material of the display panel 110, may be an actually transparent light-transmissive substrate. The first substrate SUB1 may be either a rigid substrate including glass or reinforced glass, or a flexible substrate made of a plastic material. However, the material of the first substrate SUB1 is not limited thereto, and the first substrate SUB1 may be made of various materials.

The buffer layer 112 may prevent a phenomenon in which metal atoms or impurities diffuse (e.g., outgassing) from the first substrate SUB1. Further, when the first substrate SUB1 has irregular surface flatness, the buffer layer 112 may function to improve the surface flatness of the first substrate SUB1. The buffer layer 112 may include an inorganic material, such as oxide or nitride, an organic material, or organic/inorganic compounds, and may be formed of a single-layer or multilayer structure of organic materials and inorganic materials. For example, the buffer layer 112 may have a structure of three or more layers formed of silicon oxide, silicon nitride, and silicon oxide. In the non-display area NA, the buffer layer 112 may be formed of only an inorganic material, but exemplary embodiments are not limited thereto.

The gate insulating layer 113, the first interlayer insulating layer 114, the second interlayer insulating layer 115-1, and the third interlayer insulating layer 115-2 are sequentially stacked on the buffer layer 112. Each of the gate insulating layer 113, the first interlayer insulating layer 114, the second interlayer insulating layer 115-1, and the third interlayer insulating layer 115-2 may include an inorganic layer and/or an organic layer. In an example, each of the gate insulating layer 113, the first interlayer insulating layer 114, the second interlayer insulating layer 115-1, and the third interlayer insulating layer 115-2 may be formed of, but is not limited to, an inorganic layer including $SiO_x$ or $SiN_x$. For example, each of the gate insulating layer 113, the first interlayer insulating layer 114, the second interlayer insulating layer 115-1, and the third interlayer insulating layer 115-2 may include an inorganic insulating material, such as $SiO_x$, $SiN_x$, SiON, SiOF, or $AlO_x$, or an organic insulating material, and may have a single-layer structure or a multi-layer structure including at least one of these materials. In the non-display area NA, each of the gate insulating layer 113, the first interlayer insulating layer 114, the second interlayer insulating layer 115-1, and the third interlayer insulating layer 115-2 may be formed of, but is not limited to, only an inorganic material.

Each of the buffer layer 112, the gate insulating layer 113, the first interlayer insulating layer 114, the second interlayer insulating layer 115-1, and the third interlayer insulating layer 115-2 may be formed of only an inorganic material in the non-display area NA, thus forming an inorganic insulating layer. Such an inorganic insulating layer may provide robustness against external force applied due to bending in the non-display area NA, especially, in the bending area BA and an area adjacent thereto.

In an exemplary embodiment, a first conductive layer, a second conductive layer, a third conductive layer, and a fourth conductive layer may be disposed on the gate insulating layer 113, the first interlayer insulating layer 114, the second interlayer insulating layer 115-1, and the third interlayer insulating layer 115-2, respectively. In an exemplary embodiment, the first conductive layer may be a first gate layer, the second conductive layer may be a second gate layer, the third conductive layer may be a third gate layer, and the fourth conductive layer may be a source-drain layer.

In an exemplary embodiment, a connector in the form of, e.g., a bridge pattern BRP may be provided on the third conductive layer to electrically couple element together. The bridge pattern BRP may extend approximately perpendicularly to the power line PL and the first extension part EP1 in the non-display area NA. The bridge pattern BRP may be coupled to the power line PL through the first and second contact holes CT1 and CT2, which are formed through the third interlayer insulating layer 115-2, and may be coupled to the light blocking layer PHL through the third and fourth contact holes CT3 and CT4, which are formed through the buffer layer 112, the gate insulating layer 113, the first interlayer insulating layer 114, and the second interlayer insulating layer 115-1.

In an exemplary embodiment, the power line PL may be provided on the fourth conductive layer. The power line PL may extend approximately along the second direction DR2 in the non-display area NA, but is not limited thereto. Such a power line PL may receive the first power ELVDD from a pad P provided in the pad area PA. The power line PL may be coupled to the bridge pattern BRP through the first contact holes CT1 and CT2, which are formed through the third interlayer insulating layer 115-2. Since the bridge pattern BRP is coupled to the light-blocking layer PHL through the third and fourth contact holes CT3 and CT4, the power line PL may consequently be electrically coupled to the light-blocking layer PHL.

A protective layer 116 may be provided on the third interlayer insulating layer 115-2. In an exemplary embodiment, the protective layer 116 may include a passivation layer and/or a planarization layer. Such a protective layer 116 may have a top surface that may be approximately planarized, and may be formed as a single-layer or multilayer structure.

A first protective layer PTL1 may be provided on the protective layer 116. The first protective layer PTL1 may be formed of a thin-film encapsulation layer. In an exemplary embodiment, the thin-film encapsulation layer may be replaced with another type of encapsulation layer or encapsulation substrate, or at least one protective layer or the like.

The thin-film encapsulation layer may prevent a permeation of oxygen and moisture from the outside. For this operation, the thin-film encapsulation layer may include an inorganic layer. The inorganic layer may include at least one of silicon oxide, silicon nitride, silicon oxynitride, aluminum oxide, titanium oxide, zirconium oxide, and tin oxide.

The light-blocking layer PHL may be disposed between the first substrate SUB1 and the buffer layer 112, and may be configured to selectively transmit incident light. In the non-display area NA, the light-blocking layer PHL may include the first extension part EP1 which is adjacent to the power line PL and extends approximately parallel to the power line PL. The width of the first extension part EP1 may be less than or equal to that of the power line PL.

The width of the bridge pattern BRP may be equal to or different from that of the power line PL. When the bridge pattern BRP has a width at least similar to a substantially large width of the power line PL, the bridge pattern BRP may electrically couple the first extension part EP1 to the power line PL through a plurality of contact holes such as the first to fourth contact holes CT1 to CT4.

Additional components coupled to the power line PL may act as a parallel resistor receiving the voltage of power (e.g., first power ELVDD) supplied through the power line PL. As described above, when the first extension part EP1 and the power line PL are electrically coupled to each other in a large area, the power line PL and the light-blocking layer PHL may be coupled to each other through a larger number of contact holes. In this case, the contact holes and the light-blocking layer PHL coupled to the power line PL through respective contact holes may act as respective parallel resistors. Since an increase in the number of parallel resistors results in a decrease in the overall resistance coupled to the power line PL, the supply of power through the power line PL may be efficiently performed, with the result that IR drop and/or voltage drop occurring in the display panel 110 may be improved or reduce. As such, the display device 10 may supply the power through the power line PL with improved reliability, and the light-emitting element LD may emit light as desired. Accordingly, the photosensors PHS may receive a desired amount of light to sense a fingerprint with improved accuracy.

Although the power line PL and the bridge pattern BRP are shown as being coupled to each other through four contact holes and the bridge pattern BRP and the extension part EP1 are shown as being coupled to each other through four contact holes in FIGS. 10A and 10B, exemplary embodiments are not limited thereto. In exemplary embodiments, the power line PL and the bridge pattern BRP and/or the bridge pattern BRP and the first extension part EP1 may be respectively coupled to each other through a larger number of contact holes or a smaller number of contact holes. In exemplary embodiments, the number of contact holes for coupling the power line PL to the bridge pattern BRP and the number of contact holes for coupling the bridge pattern BRP to the first extension part EP1 may be equal to or different from each other.

Figure 11A:
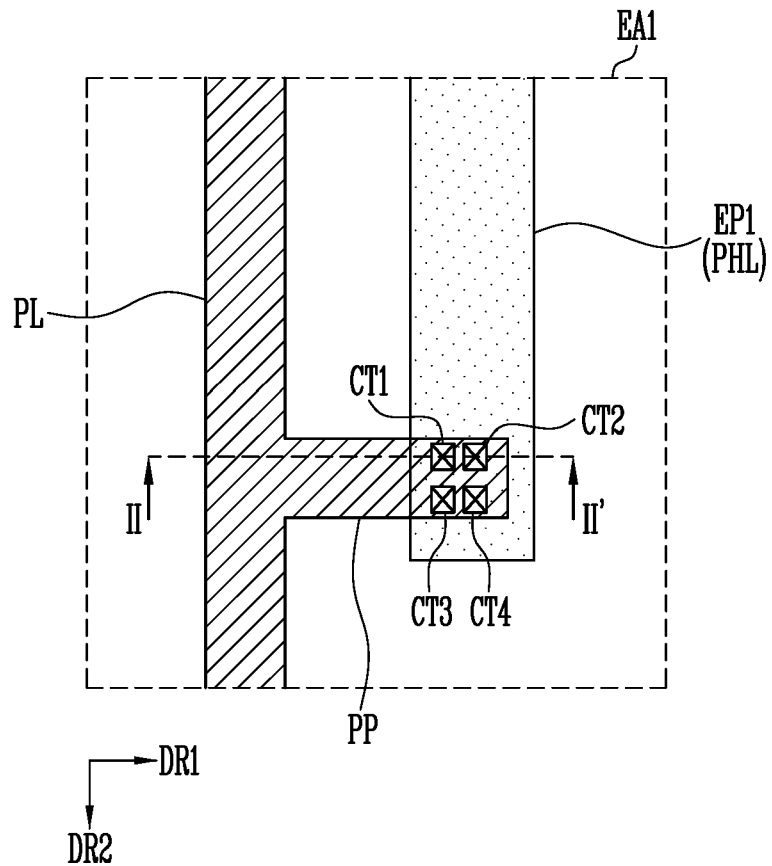
FIG. 11A is an enlarged plan view of another exemplary embodiment of portion EA1 of FIG. 1B.
Figure 11B:
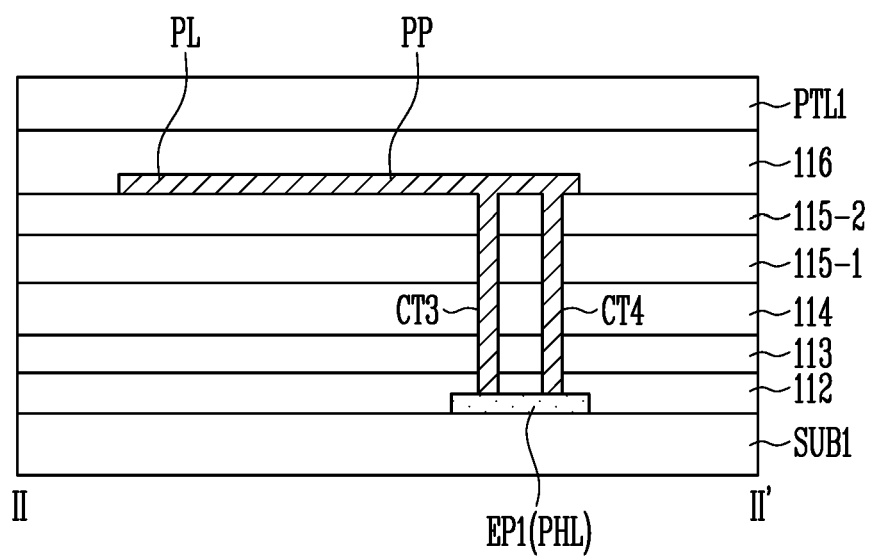
FIG. 11B is a cross-sectional view taken along line II-IF of FIG. 11A.

FIG. 11A is an enlarged plan view of another exemplary embodiment of portion EA1 of FIG. 1B. FIG. 11B is a cross-sectional view taken along line II-II' of FIG. 11A. In description of FIGS. 11A and 11B, the same reference numerals are assigned to the same components as those in the embodiment of FIGS. 10A and 10B, and detailed descriptions thereof will be omitted to avoid redundancy.

In the embodiment of FIGS. 11A and 11B, the power line PL and the first extension part EP1 may be coupled to each other without passing through the bridge pattern BRP. For this, the power line PL may include a protrusion pattern PP protruding towards the first extension part EP1.

The protrusion pattern PP may extend from the power line PL towards the first extension part EP1 in a direction perpendicular to the power line PL. The width of the protrusion pattern PP in a second direction DR2 may be substantially the same as that of the power line PL. When the width of the protrusion pattern PP is substantially the same as the relatively large width of the power line PL, the protrusion pattern PP and the first extension part EP1 may be electrically coupled to each other in a large area through a large number of contact holes CT1 to CT4. For example, the protrusion pattern PP and the first extension part EP1 may be electrically coupled to each other through a plurality of contact holes CT1 to CT4, which are formed through the buffer layer 112, the gate insulating layer 113, the first interlayer insulating layer 114, the second interlayer insulating layer 115-1, and the third interlayer insulating layer 115-2.

In FIGS. 11A and 11B, an example in which the protrusion pattern PP and the first extension part EP1 are coupled to each other through the four contact holes CT1 to CT4 is illustrated, but exemplary embodiments are not limited thereto. For example, the protrusion pattern PP and the first extension part EP1 may be coupled to each other through a larger number of or a smaller number of contact holes.

Figure 12A:
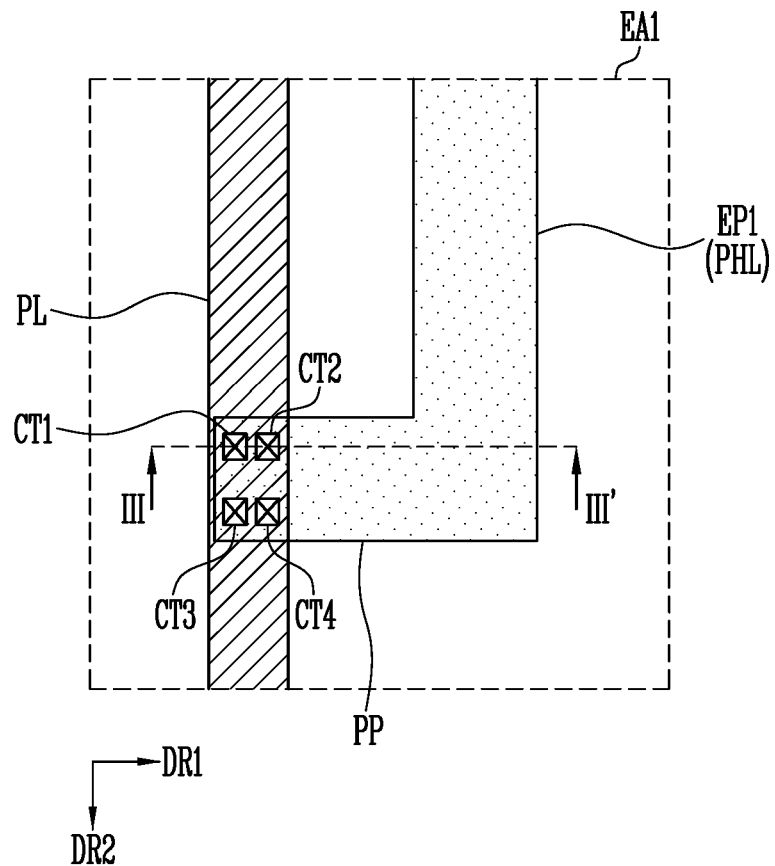
FIG. 12A is an enlarged plan view of still another exemplary embodiment of portion EA1 of FIG. 1B.
Figure 12B:
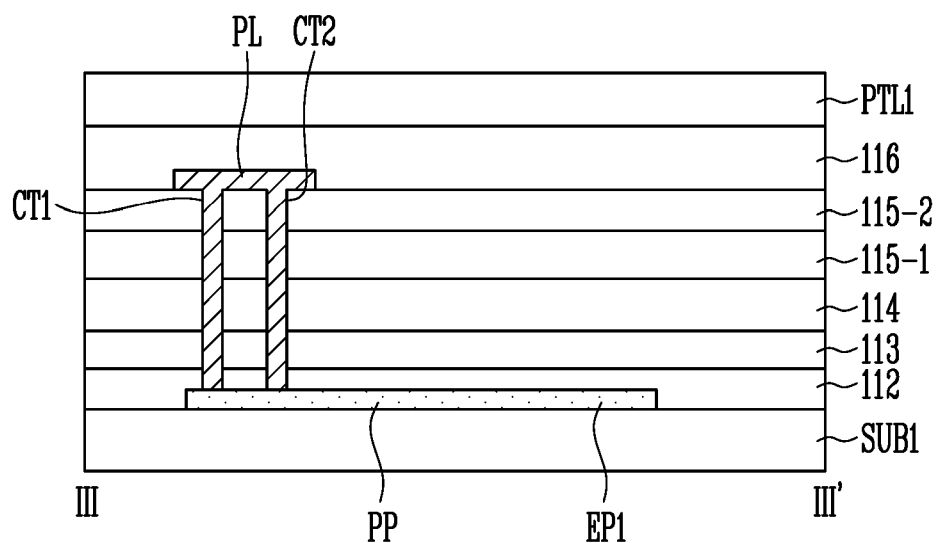
FIG. 12B is a cross-sectional view taken along line of FIG. 12A.

FIG. 12A is an enlarged plan view of still another exemplary embodiment of portion EA1 of FIG. 1B. FIG. 12B is a cross-sectional view taken along line of FIG. 12A. In description of FIGS. 12A and 12B, the same reference numerals are assigned to the same components as those in the embodiment of FIGS. 10A and 10B, and detailed descriptions thereof will be omitted to avoid redundancy.

Referring to FIGS. 12A and 12B, the power line PL and the first extension part EP1 may be coupled to each other without passing through the bridge pattern BRP. For this, the first extension part EP1 may include a protrusion pattern PP protruding towards the power line PL.

The protrusion pattern PP may extend from the first extension part EP1 to the power line PL in a direction perpendicular to the first extension part EP1. The width of the protrusion pattern PP in a second direction DR2 may be substantially the same as that of the power line PL or the first extension part EP1. When the width of the protrusion pattern PP is substantially the same as the relatively large width of the power line PL or the first extension part EP1, the protrusion pattern PP and the power line PL may be electrically coupled to each other in a large area through a large number of contact holes CT1 to CT4. For example, the protrusion pattern PP and the first extension part EP1 may be electrically coupled to each other through a plurality of contact holes CT1 to CT4, which are formed through the buffer layer 112, the gate insulating layer 113, the first interlayer insulating layer 114, the second interlayer insulating layer 115-1, and the third interlayer insulating layer 115-2.

While the protrusion pattern PP and the power line PL are shown as being coupled to each other through the four contact holes CT1 to CT4 in FIGS. 12A and 12B, exemplary embodiments are not limited thereto. The protrusion pattern PP and the power line PL may be coupled to each other through a larger number of or a smaller number of contact holes.

FIGS. 13A to 13D are graphs for illustrating the change in the characteristics of a transistor in a circuit-element layer attributable to voltage applied to a light-blocking layer.

As described above with reference to FIGS. 10A to 12B, when first power ELVDD of the power line PL is applied to the light-blocking layer PHL, electrical characteristics of at least one circuit element provided in the circuit-element layer BPL, for example, transistors of pixels, may be changed.

Figure 13A:
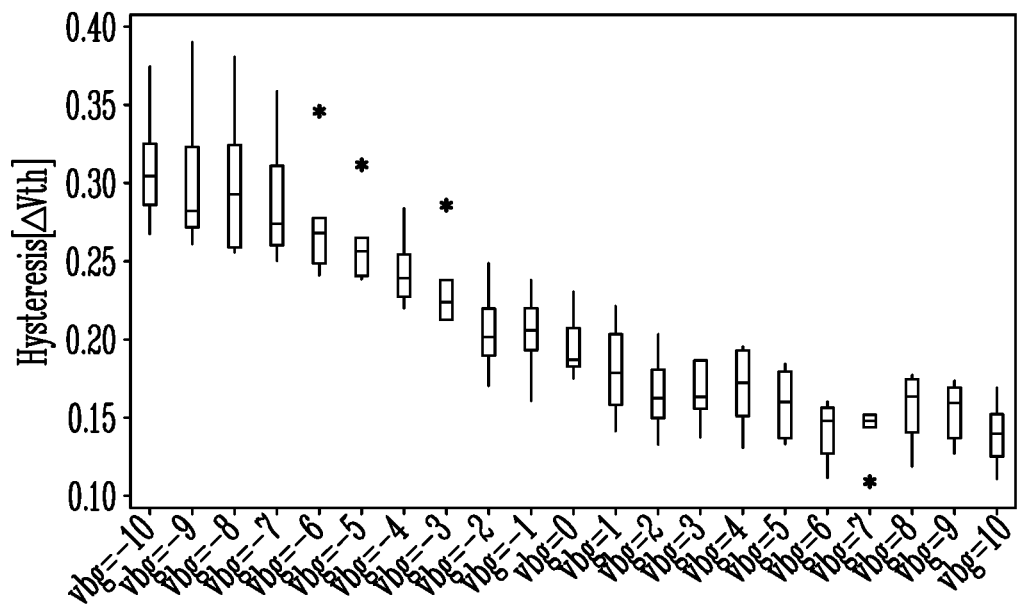
FIGS. 13A to 13D are graphs for illustrating the change in the characteristics of a transistor in a circuit-element layer attributable to voltage applied to a light-blocking layer.

Referring to FIG. 13A, depending on the level of a voltage Vbg (e.g., the first power ELVDD) applied to the light-blocking layer PHL, the field effect of the light-blocking layer PHL may vary, and hysteresis characteristics of the transistors provided in the circuit-element layer BPL may change. For example, when the level of the voltage Vbg applied to the light-blocking layer PHL increases, hysteresis characteristics of respective transistors may decrease.

Figure 13B:
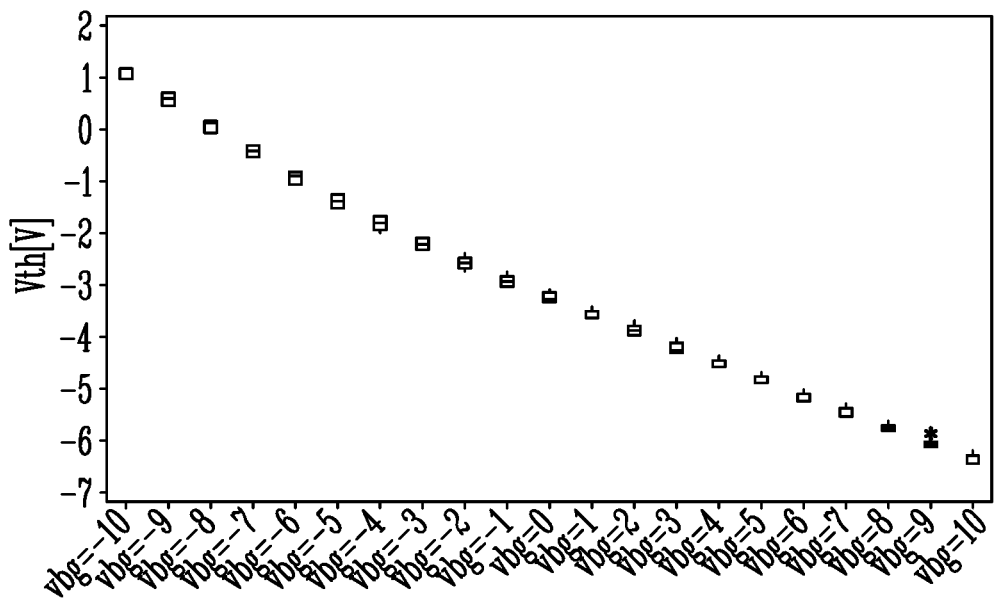

In detail, referring to FIG. 13B, depending on the level of the voltage Vbg applied to the light-blocking layer PHL, the field effect of the light-blocking layer PHL may vary, and threshold voltage characteristics of the transistors provided in the circuit-element layer BPL may change. For example, when the level of the voltage Vbg applied to the light-blocking layer PHL increases, threshold voltages of respective transistors may decrease.

Figure 13C:
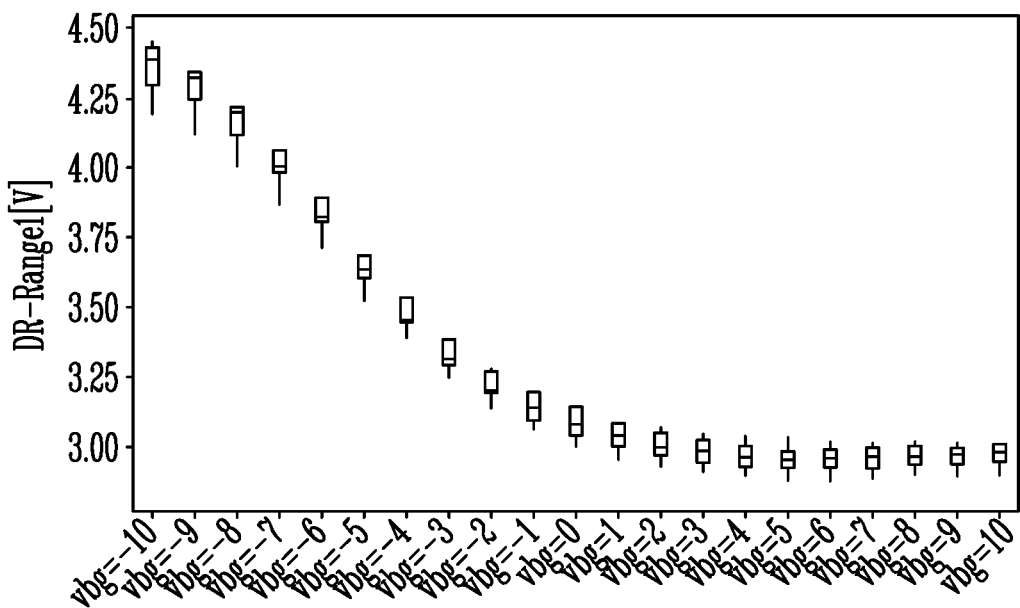
Figure 13D:
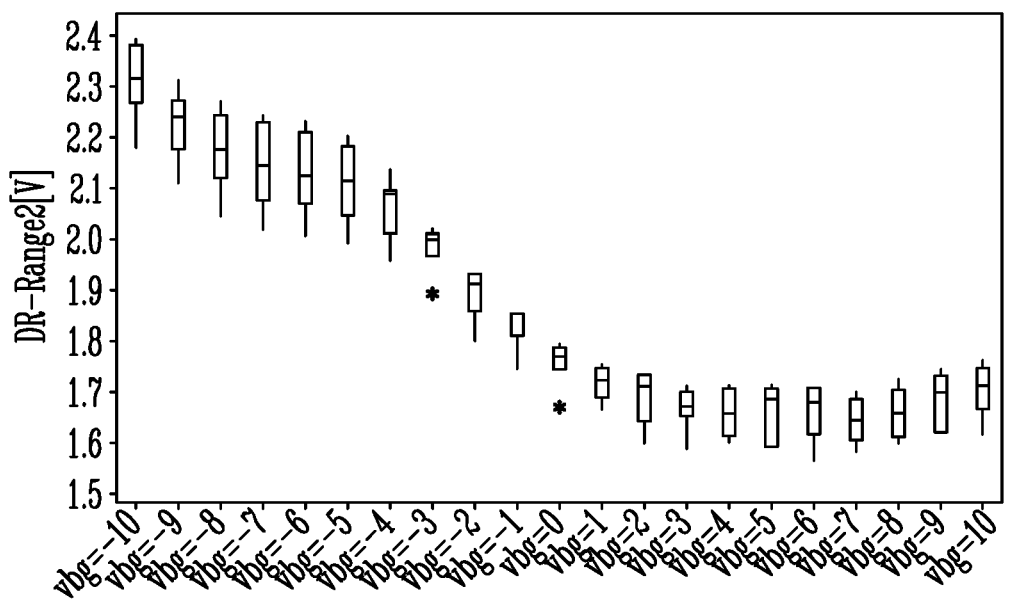

Referring to FIGS. 13C and 13D, depending on the level of the voltage Vbg applied to the light-blocking layer PHL, the characteristics of gate driving ranges of respective transistors provided in the circuit-element layer BPL may change. For example, when the level of the voltage Vbg applied to the light-blocking layer PHL increases, the gate driving ranges of respective transistors may decrease.

As described above, when electrical characteristics of transistors change depending on the voltage levels of the voltage Vbg applied to the light-blocking layer PHL, the amount of current flowing through a light-emitting element LD coupled to the transistors may change. When the amount of current flowing through the light-emitting element LD changes, the amount (or intensity) of light emitted from the light-emitting element LD may change. For example, electrical characteristics of the transistors may change as shown in FIGS. 13A to 13D when the voltage Vbg applied to the light-blocking layer PHL increases, and this may cause the light-emitting element LD to receive more current. When the amount (or intensity) of light emitted from the light-emitting element LD increases, the amount (or intensity) of reflected light that is incident on the pin holes PIH of the light-blocking layer PHL may increase, with the result that the amount (or intensity) of light having reached the photosensors PHS of the sensor layer PSL after passing through the pinholes PIH may also increase. Due thereto, the photosensors PHS may output a sensing signal based on the optical characteristics of a larger amount of reflected light, and thereby improving the accuracy of fingerprint sensing based on the sensing signal.

Figure 14:
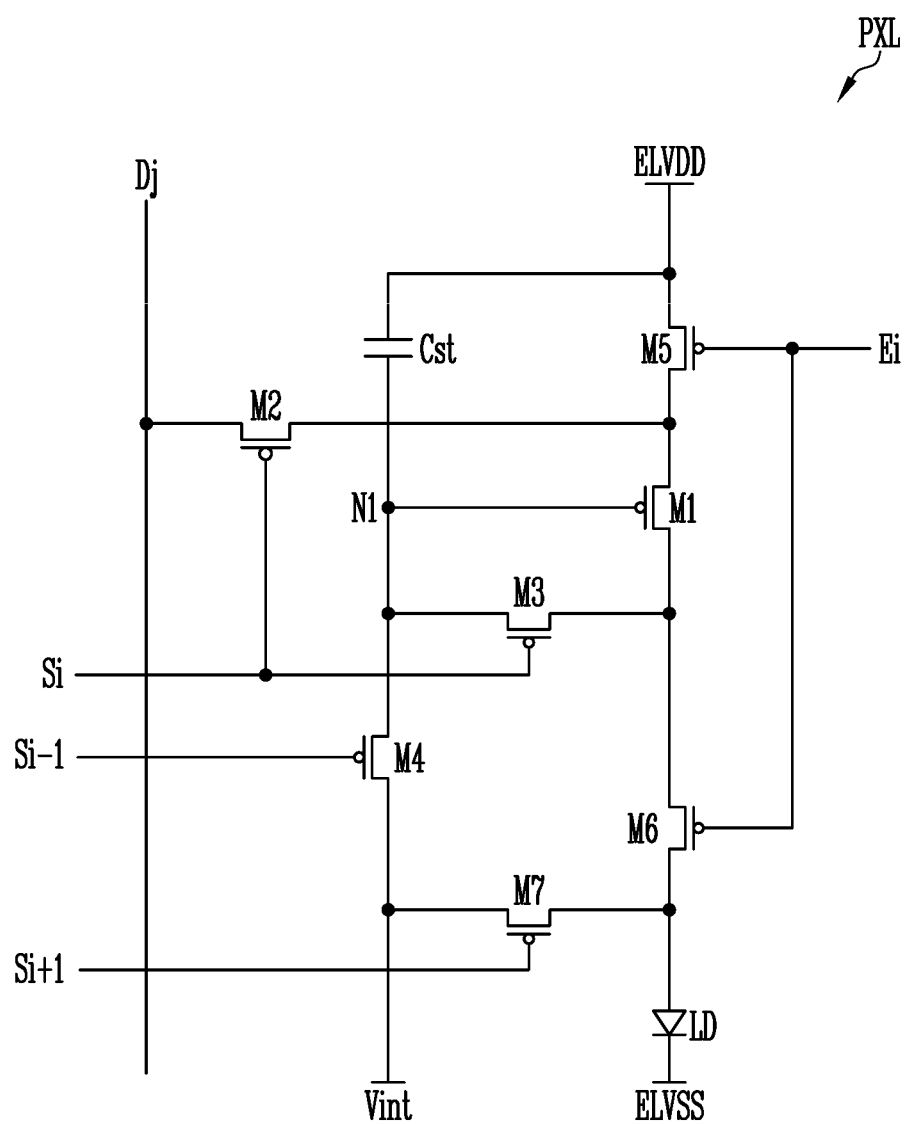
FIG. 14 is a circuit diagram of an exemplary embodiment of a representative pixel constructed according to the principles of the invention.

FIG. 14 is a circuit diagram of an exemplary embodiment of a representative pixel constructed according to the principles of the invention. For convenience of description, FIG. 14 illustrates an active pixel, which includes seven transistors and is coupled to an i-th scan line Si, an i-th emission control line Ei, and a j-th data line Dj. Here, the i-th scan line Si is disposed in an i-th horizontal pixel line and the j-th data line Dj is disposed in a j-th vertical pixel line (where i and j are natural numbers). However, exemplary embodiments of the structure of the pixel PXL are not limited thereto.

Referring to FIG. 14, the pixel PXL may include first to seventh transistors M1 to M7, a storage capacitor Cst, and a light-emitting element LD.

The first electrode of the first transistor (driving transistor) M1 may be coupled to a first power source ELVDD via the fifth transistor M5, and the second electrode thereof may be coupled to the anode electrode of the light-emitting element LD via the sixth transistor M6. Also, the gate electrode of the first transistor M1 may be coupled to a first node N1. The first transistor M1 may control the amount of current, flowing from the first power source ELVDD to a second power source ELVSS via the light-emitting element LD, in response to the voltage of the first node N1.

The second transistor (switching transistor) M2 may be coupled between the j-th data line Dj and the first electrode of the first transistor M1. Also, the gate electrode of the second transistor M2 may be coupled to the i-th scan line Si. The second transistor M2 is turned on when a scan signal is supplied to the i-th scan line Si, thereby electrically coupling the j-th data line Dj to the first electrode of the first transistor M1.

The third transistor M3 may be coupled between the second electrode of the first transistor M1 and the first node N1. Also, the gate electrode of the third transistor M3 may be coupled to the i-th scan line Si. The third transistor M3 is turned on when a scan signal having a gate-on voltage is supplied to the i-th scan line Si, thereby electrically coupling the second electrode of the first transistor M1 to the first node N1. Accordingly, when the third transistor M3 is turned on, the first transistor M1 may be coupled in the form of a diode.

The fourth transistor (initialization transistor) M4 may be coupled between the first node N1 and an initialization power source Vint. Also, the gate electrode of the fourth transistor M4 may be coupled to an (i−1)-th scan line Si−1. The fourth transistor M4 is turned on when a scan signal is supplied to the (i−1)-th scan line Si−1, thereby supplying the voltage of the initialization power source Vint to the first node N1.

FIG. 14 illustrates an embodiment in which the (i−1)-th scan line Si−1 is used as an initialization control line for initializing the gate electrode of the first transistor M1, that is, the first node N1. However, exemplary embodiments are not limited thereto. For example, another control line, such as an (i−2)-th scan line Si−2, may be used as the initialization control line for initializing the gate electrode of the first transistor M1.

The fifth transistor M5 may be coupled between the first power source ELVDD and the first transistor M1. Also, the gate electrode of the fifth transistor M5 may be coupled to the i-th emission control line Ei. When an emission control signal having a gate-off voltage is supplied to the i-th emission control line Ei, the fifth transistor M5 may be turned off. Otherwise, the fifth transistor M5 may be turned on.

The sixth transistor M6 may be coupled between the first transistor M1 and the light-emitting element LD. Also, the gate electrode of the sixth transistor M6 may be coupled to the i-th emission control line Ei. When an emission control signal having a gate-off voltage (e.g., a high-level voltage) is supplied to the i-th emission control line Ei, the sixth transistor M6 may be turned off. Otherwise, the sixth transistor M6 may be turned on.

The seventh transistor M7 may be coupled between the initialization power source Vint and the first electrode of the light-emitting element LD, for example, the anode electrode thereof. Also, the gate electrode of the seventh transistor M7 may be coupled to an (i+1)-th scan line Si+1. The seventh transistor M7 is turned on when a scan signal having a gate-on voltage (e.g., a low-level voltage) is supplied to the (i+1)-th scan line Si+1, thereby supplying the voltage of the initialization power source Vint to the anode electrode of the light-emitting element LD. Here, the voltage of the initialization power source Vint may be set lower than the voltage of a data signal. That is, the voltage of the initialization power source Vint may be set so as to be equal to or less than the lowest voltage of the data signal.

FIG. 14 illustrates an example in which the anode initialization control line, to which the gate electrode of the seventh transistor M7 is coupled, is the (i+1)-th scan line Si+1. However, exemplary embodiments are not limited to this example. For example, the gate electrode of the seventh transistor M7 may be coupled to the i-th scan line Si. In this case, the voltage of the initialization power source Vint may be supplied to the anode electrode of the light-emitting element LD via the seventh transistor M7 when a scan signal having a gate-on voltage is supplied to the i-th scan line Si.

The storage capacitor Cst may be coupled between the first power source ELVDD and the first node N1. The storage capacitor Cst may store a voltage corresponding to the data signal and the threshold voltage of the first transistor M1.

The anode electrode of the light-emitting element LD may be coupled to the first transistor M1 via the sixth transistor M6, and the cathode electrode thereof may be coupled to the second power source ELVSS. The light-emitting element LD generates light having predetermined luminance in response to the amount of current supplied from the first transistor M1. In order to enable a current to flow in the light-emitting element LD, the voltage of the first power source ELVDD may be set higher than the voltage of the second power source ELVSS.

The structure of the pixel PXL is not limited to the embodiment illustrated in FIG. 14. For example, a pixel circuit having any of various structures that are currently known may be applied to the pixel PXL.

FIG. 14 illustrates an example in which the transistors M1 to M7 are P-type transistors, but exemplary embodiments are not limited thereto. For example, at least one of the transistors M1 to M7 may be replaced with an N-type transistor.

Figure 15:
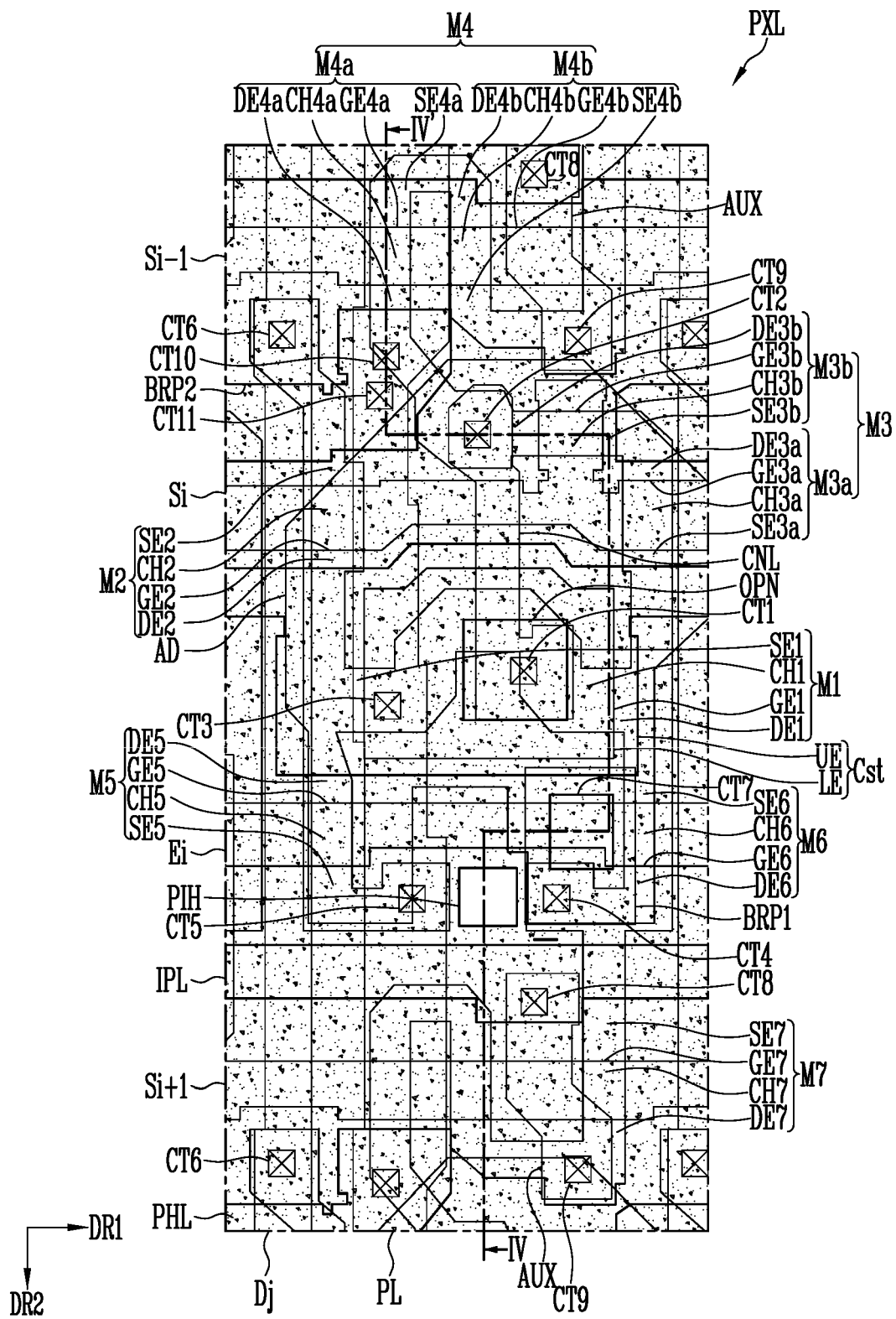
FIG. 15 is a plan view of an exemplary embodiment of a layout including the pixel of FIG. 14 and a light-blocking layer constructed according to the principles of the invention.
Figure 16:
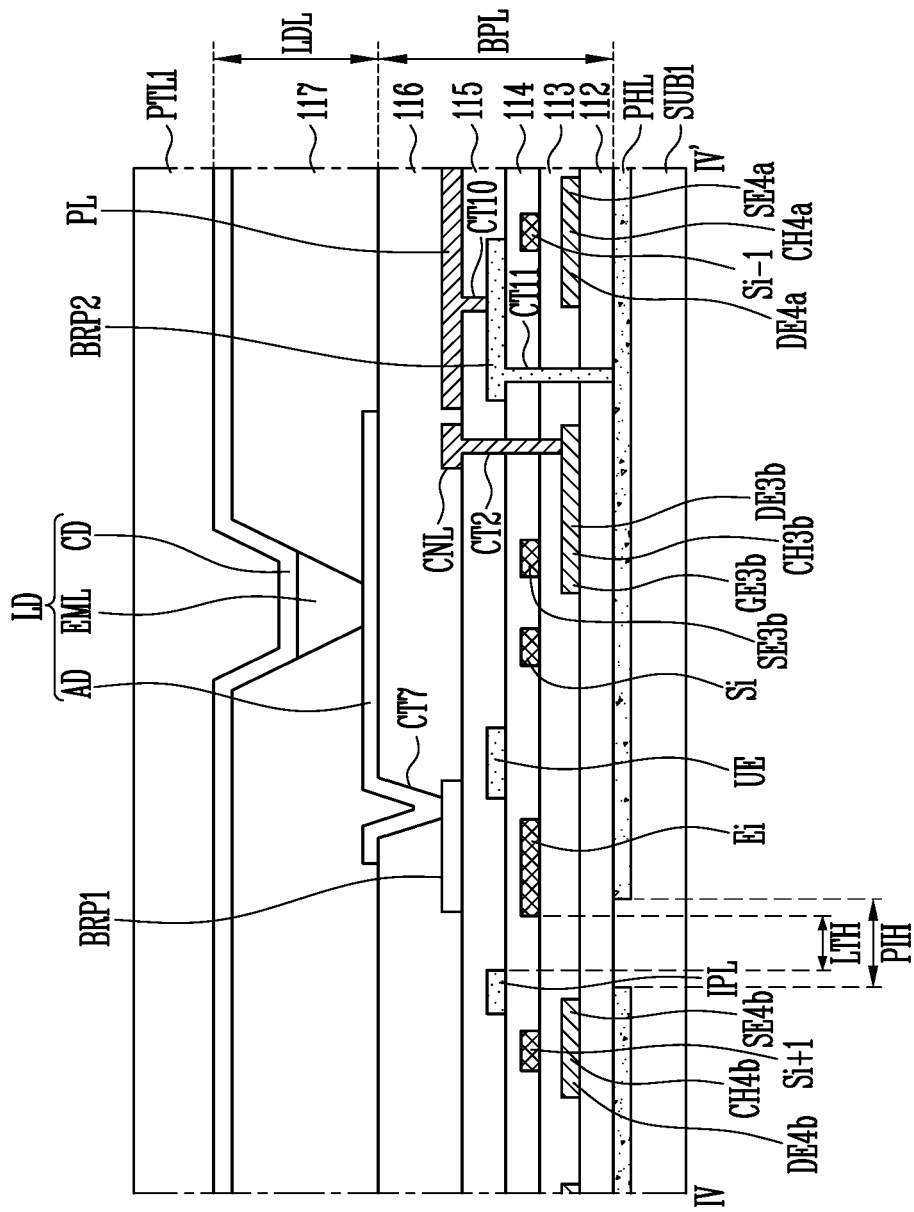
FIG. 16 is a cross-sectional view taken along line IV-IV' of FIG. 15.

FIG. 15 is a plan view of an exemplary embodiment of a layout including the pixel of FIG. 14 and a light-blocking layer constructed according to the principles of the invention. FIG. 16 is a cross-sectional view taken along line IV-IV' of FIG. 15. Specifically, FIG. 15 illustrates the layout of a pixel PXL including a light transmission hole LTH that overlaps the pinhole PIH of a light-blocking layer PHL, among arbitrary pixels PXL disposed in the display area AA of FIGS. 1A to 1C.

In FIG. 15 and FIG. 16, the scan line of the (i−1)-th row is referred to as the (i−1)-th scan line Si−1, the scan line of the i-th row is referred to as the i-th scan line Si, the scan line of the (i+1)-th row is referred to as the (i+1)-th scan line Si+1, the emission control line of the i-th row is referred to as the emission control line Ei, the data line of the j-th column is referred to as the data line Dj, and the power line of the j-th column, for example, the power line of the j-th column, to which power of the first power source ELVDD is applied, is referred to as the power line PL for convenience of description.

Referring to FIG. 15 and FIG. 16, the display device 10 may include pixels PXL disposed in the display area AA and lines for supplying driving signals and/or power to the pixels PXL. The lines may include the scan lines Si−1, Si and Si+1, the data line Dj, the emission control line Ei, the power line PL, and the initialization power line IPL.

The scan lines Si−1, Si and Si+1 may extend in a first direction DR1 in the display area AA. The scan lines Si−1, Si and Si+1 may include the (i−1)-th scan line Si−1, the i-th scan line Si, and the (i+1)-th scan line Si+1, which are sequentially arranged along a second direction DR2 that intersects with the first direction DR1. The scan lines Si−1, Si and Si+1 may receive scan signals applied thereto. For example, the (i−1)-th scan line Si−1 may receive the (i−1)-th scan signal applied thereto, the i-th scan line Si may receive the i-th scan signal applied thereto, and the (i+1)-th scan line Si+1 may receive the (i+1)-th scan signal applied thereto.

The emission control line Ei may extend in the first direction DR1 so as to be parallel to the scan lines Si−1, Si and Si+1 in the display area AA. The emission control line Ei may receive an emission control signal applied thereto.

The data line Dj may extend in the second direction DR2 in the display area AA. That is, the data line Dj may extend in the direction that intersects with the control lines Si−1, Si, Si+1 and Ei, including the scan lines Si−1, Si and Si+1 and the emission control line Ei. The data line Dj may receive a data signal applied thereto.

The power line PL may extend in the second direction DR2 in the display area AA, but is not limited thereto. The power line PL may be disposed so as to be spaced apart from the data line Dj, and may receive power of the first power source ELVDD applied thereto.

The initialization power line IPL may extend in the first direction DR1 in the display area AA, but is not limited thereto. The initialization power line IPL may receive power of the initialization power source Vint applied thereto.

In an exemplary embodiment, the pixel PXL may include first to seventh transistors M1 to M7, a storage capacitor Cst, and a light-emitting element LD.

The first transistor M1 may include a first gate electrode GE1, a first source electrode SE1, and a first drain electrode DE1.

In an exemplary embodiment, the first gate electrode GE1 may be disposed so as to overlap the first channel CH1 of an active pattern ACT while interposing at least one insulating layer, for example, a gate insulating layer 113, therebetween. The first gate electrode GE1 may be coupled to the third drain electrode DE3 (including DE3A and DE3B) of the third transistor M3 and the fourth source electrode SE4 (including SE4A and SE4B) of the fourth transistor M4.

The first gate electrode GE1 may be coupled to the third drain electrode DE3 and the fourth source electrode SE4 through a connection line CNL. One end of the connection line CNL may be coupled to the first gate electrode GE1 through a first contact hole CT1, and the other end thereof may be coupled to the third drain electrode DE3 and the fourth source electrode SE4 through a second contact hole CT2.

In an exemplary embodiment, the first channel CH1, the first source electrode SE1, and the first drain electrode DE1 may be formed of a semiconductor pattern that is not doped with or is doped with impurities. For example, the first source electrode SE1 and the first drain electrode DE1 may be formed of a semiconductor pattern doped with impurities, and the first channel CH1 may be formed of a semiconductor pattern that is not doped with impurities.

The first channel CH1 has a shape extending in an arbitrary direction, and may have a shape in which it is bent multiple times along the direction in which the first channel CH1 extends. The first channel CH1 may overlap the first gate electrode GE1 when viewed from a plan view. The first channel CH1 is formed lengthways, whereby the channel region of the first transistor M1 may be formed lengthways. Accordingly, the driving range of the gate voltage applied to the first transistor M1 increases. Accordingly, the grayscale of light emitted from the light-emitting element LD may be minutely controlled.

The first source electrode SE1 may be coupled to one end of the first channel CH1. The first source electrode SE1 may be coupled to the second drain electrode DE2 of the second transistor M2 and the fifth drain electrode DE5 of the fifth transistor M5. In an exemplary embodiment, the first drain electrode DE1 may be coupled to the other end of the first channel CH1. The first drain electrode DE1 may be coupled to the third source electrode SE3 of the third transistor M3 and the sixth source electrode SE6 of the sixth transistor M6.

The second transistor M2 may include a second gate electrode GE2, a second channel CH2, a second source electrode SE2, and the second drain electrode DE2.

The second gate electrode GE2 may be disposed so as to overlap the second channel CH2 while interposing at least one insulating layer, for example, the gate insulating layer 113, therebetween. The second gate electrode GE2 may be coupled to the i-th scan line Si.

The second channel CH2, the second source electrode SE2, and the second drain electrode DE2 may be formed of a semiconductor pattern that is not doped with or is doped with impurities. For example, the second source electrode SE2 and the second drain electrode DE2 may be formed of a semiconductor pattern doped with impurities, and the second channel CH2 may be formed of a semiconductor pattern that is not doped with impurities. The second channel CH2 may be a part overlapping the second gate electrode GE2.

One end of the second source electrode SE2 may be coupled to the second channel CH2, and the other end thereof may be coupled to the data line Dj through a sixth contact hole CT6. In an exemplary embodiment, one end of the second drain electrode DE2 may be coupled to the second channel CH2, and the other end thereof may be coupled to the first source electrode SE1 of the first transistor M1 and the fifth drain electrode DE5 of the fifth transistor M5.

The third transistor M3 may be provided such that it has a double-gate structure in order to prevent a leakage current. That is, the third transistor M3 may include a 3A-th transistor M3A and a 3B-th transistor M3B. The 3A-th transistor M3A may include a 3A-th gate electrode GE3A, a 3A-th active pattern ACT3A, a 3A-th source electrode SE3A, and the 3A-th drain electrode DE3A. The 3B-th transistor M3B may include a 3B-th gate electrode GE3B, a 3B-th active pattern ACT3B, a 3B-th source electrode SE3B, and the 3B-th drain electrode DE3B. Hereinafter, the 3A-th gate electrode GE3A and the 3B-th gate electrode GE3B are referred to as the third gate electrode GE3, the 3A-th active pattern ACT3A and the 3B-th active pattern ACT3B are referred to as the third channel CH3, the 3A-th source electrode SE3A and the 3B-th source electrode SE3B are referred to as the third source electrode SE3, and the 3A-th drain electrode DE3A and the 3B-th drain electrode DE3B are referred to as the third drain electrode DE3.

The third gate electrode GE3 may be disposed so as to overlap the third channel CH3 while interposing at least one insulating layer, for example, the gate insulating layer 113, therebetween. The third gate electrode GE3 may be coupled to the i-th scan line Si.

The third channel CH3, the third source electrode SE3, and the third drain electrode DE3 may be formed of a semiconductor pattern that is not doped with or is doped with impurities. For example, the third source electrode SE3 and the third drain electrode DE3 may be formed of a semiconductor pattern doped with impurities, and the third channel CH3 may be formed of a semiconductor pattern that is not doped with impurities. The third channel CH3 is a part overlapping the third gate electrode GE3.

One end of the third source electrode SE3 may be coupled to the third channel CH3, and the other end thereof may be coupled to the first drain electrode DE1 of the first transistor M1 and the sixth source electrode SE6 of the sixth transistor M6. In an exemplary embodiment, one end of the third drain electrode DE3 may be coupled to the third channel CH3, and the other end thereof may be coupled to the fourth source electrode SE4 of the fourth transistor M4. Also, the third drain electrode DE3 may be coupled to the connection line CNL and may be coupled to the first gate electrode GE1 of the first transistor M1 through the second contact hole CT2 and the first contact hole CT1.

The fourth transistor M4 may be provided such that it has a double-gate structure in order to prevent a leakage current. That is, the fourth transistor M4 may include a 4A-th transistor M4A and a 4B-th transistor M4B. The 4A-th transistor M4A may include a 4A-th gate electrode GE4A, a 4A-th active pattern ACT4A, the 4A-th source electrode SE4A, and a 4A-th drain electrode DE4A, and the 4B-th transistor M4B may include a 4B-th gate electrode GE4B, a 4B-th active pattern ACT4B, the 4B-th source electrode SE4B, and a 4B-th drain electrode DE4B. Hereinafter, the 4A-th gate electrode GE4A and the 4B-th gate electrode GE4B are referred to as the fourth gate electrode GE4, the 4A-th active pattern ACT4A and the 4B-th active pattern ACT4B are referred to as the fourth channel CH4, the 4A-th source electrode SE4A and the 4B-th source electrode SE4B are referred to as the fourth source electrode SE4, and the 4A-th drain electrode DE4A and the 4B-th drain electrode DE4B are referred to as the fourth drain electrode DE4.

The fourth gate electrode GE4 may be disposed so as to overlap the fourth channel CH4 while interposing at least one insulating layer, for example, the gate insulating layer 113, therebetween. The fourth gate electrode GE4 may be coupled to the (i−1)-th scan line Si−1.

The fourth channel CH4, the fourth source electrode SE4, and the fourth drain electrode DE4 may be formed of a semiconductor pattern that is not doped with or is doped with impurities. For example, the fourth source electrode SE4 and the fourth drain electrode DE4 may be formed of a semiconductor pattern doped with impurities, and the fourth channel CH4 may be formed of a semiconductor pattern that is not doped with impurities. The fourth channel CH4 is a part overlapping the fourth gate electrode GE4.

One end of the fourth source electrode SE4 may be coupled to the fourth channel CH4, and the other end thereof may be coupled to the third drain electrode DE3 of the third transistor M3. Also, the fourth source electrode SE4 may be coupled to the connection line CNL and may be coupled to the first gate electrode GE1 of the first transistor M1 through the second contact hole CT2 and the first contact hole CT1. One end of the fourth drain electrode DE4 may be coupled to the fourth channel CH4, and the other end thereof may be coupled to the seventh drain electrode DE7 of the seventh transistor M7 of the pixel PXL of the (i−1)-th row. The fourth drain electrode DE4 may be coupled to an auxiliary connection line AUX and may be coupled to the initialization power line IPL through a ninth contact hole CT9 and an eighth contact hole CTB.

The fifth transistor M5 may include a fifth gate electrode GE5, a fifth channel CH5, a fifth source electrode SE5, and the fifth drain electrode DE5.

The fifth gate electrode GE5 may be disposed so as to overlap the fifth channel CH5 while interposing at least one insulating layer, for example, the gate insulating layer 113, therebetween. The fifth gate electrode GE5 may be coupled to the emission control line Ei.

The fifth channel CH5, the fifth source electrode SE5, and the fifth drain electrode DE5 may be formed of a semiconductor pattern that is not doped with or is doped with impurities. For example, the fifth source electrode SE5 and the fifth drain electrode DE5 may be formed of a semiconductor pattern doped with impurities, and the fifth channel CH5 may be formed of a semiconductor pattern that is not doped with impurities. The fifth channel CH5 is a part overlapping the fifth gate electrode GE5.

One end of the fifth source electrode SE5 may be coupled to the fifth channel CH5, and the other end thereof may be coupled to the power line PL through a fifth contact hole CT5. In an exemplary embodiment, one end of the fifth drain electrode DE5 may be coupled to the fifth channel CH5, and the other end thereof may be coupled to the first source electrode SE1 of the first transistor M1 and the second drain electrode DE2 of the second transistor M2.

The sixth transistor M6 may include a sixth gate electrode GE6, a sixth channel CH6, the sixth source electrode SE6, and a sixth drain electrode DE6.

The sixth gate electrode GE6 may be disposed so as to overlap the sixth channel CH6 while interposing at least one insulating layer, for example, the gate insulating layer 113, therebetween. The sixth gate electrode GE6 may be coupled to the emission control line Ei.

The sixth channel CH6, the sixth source electrode SE6, and the sixth drain electrode DE6 may be formed of a semiconductor pattern that is not doped with or is doped with impurities. For example, the sixth source electrode SE6 and the sixth drain electrode DE6 may be formed of a semiconductor pattern doped with impurities, and the sixth channel CH6 may be formed of a semiconductor pattern that is not doped with impurities. The sixth channel CH6 is a part overlapping the sixth gate electrode GE6.

One end of the sixth source electrode SE6 may be coupled to the sixth channel CH6, and the other end thereof may be coupled to the first drain electrode DE1 of the first transistor M1 and the third source electrode SE3 of the third transistor M3. In an exemplary embodiment, one end of the sixth drain electrode DE6 may be coupled to the sixth channel CH6, and the other end thereof may be coupled to the seventh source electrode SE7 of the seventh transistor M7.

The seventh transistor M7 may include a seventh gate electrode GE7, a seventh channel CH7, a seventh source electrode SE7, and a seventh drain electrode DE7.

The seventh gate electrode GE7 may be disposed so as to overlap the seventh channel CH7 while interposing at least one insulating layer, for example, the gate insulating layer 113, therebetween. The seventh gate electrode GE7 may be coupled to the (i+1)-th scan line Si+1.

The seventh channel CH7, the seventh source electrode SE7, and the seventh drain electrode DE7 may be formed of a semiconductor pattern that is not doped with or is doped with impurities. For example, the seventh source electrode SE7 and the seventh drain electrode DE7 may be formed of a semiconductor pattern doped with impurities, and the seventh channel CH7 may be formed of a semiconductor pattern that is not doped with impurities. The seventh channel CH7 is a part overlapping the seventh gate electrode GE7.

One end of the seventh source electrode SE7 may be coupled to the seventh channel CH7, and the other end thereof may be coupled to the sixth drain electrode DE6 of the sixth transistor M6. In an exemplary embodiment, one end of the seventh drain electrode DE7 may be coupled to the seventh channel CH7, and the other end thereof may be coupled to the auxiliary connection line AUX and may be coupled to the initialization power line IPL through the ninth contact hole CT9 and the eighth contact hole CTB.

The storage capacitor Cst may include a first capacitor electrode LE and a second capacitor electrode UE. In an exemplary embodiment, the first capacitor electrode LE may be the lower electrode of the storage capacitor Cst, and may be integrated with the first gate electrode GE1 of the first transistor M1. In an exemplary embodiment, the second capacitor electrode UE may be the upper electrode of the storage capacitor Cst, and may overlap the first gate electrode GE1. Also, the second capacitor electrode UE may cover at least one region of the first capacitor electrode LE when viewed from a plan view. The capacitance of the storage capacitor Cst may be increased by enlarging the region in which the first capacitor electrode LE and the second capacitor electrode UE overlap each other.

The second capacitor electrode UE may extend in the first direction DR1. In an exemplary embodiment, a voltage having the same level as the voltage of the first power source ELVDD may be applied to the second capacitor electrode UE. The second capacitor electrode UE may include an opening OPN in a region in which the first contact hole CT1, in which the first gate electrode GE1 is in contact with the connection line CNL, is formed.

The light-emitting element LD may include a first electrode (e.g., anode electrode) AD, a second electrode (e.g., cathode electrode) CD, and an emission layer EML provided between the first electrode AD and the second electrode CD. In an exemplary embodiment, the first electrode AD and the second electrode CD may be disposed so as to overlap each other in the emission area of a light-emitting element layer LDL, and the emission layer EML may be disposed in the emission area. That is, the emission area of each pixel PXL may be a region in which the first electrode AD of the light-emitting element LD, the emission layer EML thereof, and the second electrode CD thereof are disposed so as to overlap each other.

The first electrode AD may be provided in a predetermined emission area. The first electrode AD may be coupled to the seventh source electrode SE7 of the seventh transistor M7 and the sixth drain electrode DE6 of the sixth transistor M6 through a fourth contact hole CT4 and a seventh contact hole CT7. A first bridge pattern BRP1 may be provided between the fourth contact hole CT4 and the seventh contact hole CT7. The first bridge pattern BRP1 may couple the sixth drain electrode DE6, the seventh source electrode SE7, and the first electrode AD.

Hereinafter, a pixel PXL and the stack structure (cross-section structure) of a display area AA including the pixel PXL will be described.

First, a buffer layer 112 may be provided on the first surface of a first substrate SUB1. Accordingly, a phenomenon in which metal atoms or impurities diffuse (e.g., outgassing) from the first substrate SUB1 may be prevented. Also, when the first substrate SUB1 has irregular surface flatness, the buffer layer 112 may serve to improve the surface flatness of the first substrate SUB1. The buffer layer 112 may include an inorganic material, such as oxide or nitride, an organic material, or inorganic/organic compounds, and may be formed of a single-layer or multilayer structure of inorganic and organic materials. For example, the buffer layer 112 may have a structure of three or more layers formed of silicon oxide, silicon nitride, and silicon oxide.

Active patterns ACT1 to ACTT (hereinafter, referred to as 'ACT') may be provided on the buffer layer 112. In an exemplary embodiment, the active patterns ACT may include first to seventh channels CH1 to CH7. The first to seventh channels CH1 to CH7 may be formed of a semiconductor material.

A gate insulating layer 113 may be provided on the buffer layer 112 on which the first to seventh channels CH1 to CH7 are provided. In an exemplary embodiment, the gate insulating layer 113 may be a gate insulating layer interposed between the active patterns ACT1 to ACTT and the gate electrodes GE1 to GE7 of the first to seventh transistors M1 to M7 provided in the pixels PXL.

The gate insulating layer 113 may include one or more inorganic layers and/or organic layers. For example, the gate insulating layer 113 may be formed of an inorganic layer including $SiO_x$, $SiN_x$, or the like, but is not limited thereto. For example, the gate insulating layer 113 may include an inorganic insulating material, such as $SiO_x$, $SiN_x$, SiON, SiOF, $AlO_x$, or the like, or an organic insulating material, and may have a single-layer or multilayer structure including at least one of these materials.

In an exemplary embodiment, the gate insulating layer 113 may have a limited thickness falling within a predetermined range in order to easily drive the transistors M1 to M7. For example, the thickness of the gate insulating layer 113 may range from 1000 Å to 1500 Å, for example, about 1200 Å, but the thickness of the gate insulating layer 113 is not limited thereto.

A first conductive layer may be disposed on the gate insulating layer 113. In an exemplary embodiment, the first conductive layer may be a first gate layer. Control lines Si−1, Si, Si+1 and Ei and the gate electrodes GE1 to GE7 may be provided on the first conductive layer. Also, one electrode of the storage capacitor Cst, for example, the first capacitor electrode LE, may be provided on the first conductive layer. Specifically, the (i−1)-th scan line Si−1, the i-th scan line Si, the (i+1)-th scan line Si+1, the emission control line Ei, and the first to seventh gate electrodes GE1 to GE7 may be provided on the first conductive layer on the gate insulating layer 113. In an exemplary embodiment, the first gate electrode GE1 may become the first capacitor electrode LE of the storage capacitor Cst. That is, the first gate electrode GE1 and the first capacitor electrode LE may be integrated with each other.

The control lines Si−1, Si, Si+1 and Ei, the gate electrodes GE1 to GE7, and/or the first capacitor electrode LE, which is the lower electrode of the storage capacitor Cst, disposed in the first conductive layer may be formed of the same material. For example, the control lines Si−1, Si, Si+1 and Ei, the gate electrodes GE1 to GE7, and/or the first capacitor electrode LE of the storage capacitor Cst may be formed of predetermined first gate metal.

As an example of the material of the first gate metal, there may be Ti, Cu, Mo, Al, Au, Cr, TiN, Ag, Pt, Pd, Ni, Sn, Co, Rh, Ir, Fe, Ru, Os, Mn, W, Nb, Ta, Bi, Sb, Pb, and the like, and any of various types of metal may also be used. As an example of an alloy for forming the first gate metal, there may be MoTi, AlNiLa, and the like, and any of various types of alloys may also be used. As an example of a multilayer structure for forming the first gate metal, there may be Ti/Cu, Ti/Au, Mo/Al/Mo, ITO/Ag/ITO, TiN/Ti/Al/Ti, TiN/Ti/Cu/Ti, and the like, and any of various conductive materials having a multilayer structure may also be used.

The material forming the control lines Si−1, Si, Si+1 and Ei, the gate electrodes GE1 to GE7, and/or the first capacitor electrode LE disposed on the first conductive layer is not necessarily limited to metal. That is, any type of material may be used as the material forming the control lines Si−1, Si, Si+1 and Ei, the gate electrodes GE1 to GE7, and/or the first capacitor electrode LE as long as the material is capable of providing sufficient conductivity to such an extent as to smoothly drive the pixels PXL.

For example, the control lines Si−1, Si, Si+1 and Ei, the gate electrodes GE1 to GE7, and/or the first capacitor electrode LE may be formed of a conductive polymer or conductive metal oxide. As an example of the conductive polymer for forming the control lines Si−1, Si, Si+1 and Ei, the gate electrodes GE1 to GE7, and/or the first capacitor electrode LE, there may be a polythiophene-based compound, a polypyrrole-based compound, a polyaniline-based compound, a polyacetylene-based compound, a polyphenylene-based compound, and a complex thereof. Particularly, PEDOT/PSS may be used, among polythiophene-based compounds. As an example of the conductive metal oxide for forming the control lines Si−1, Si, Si+1 and Ei, the gate electrodes GE1 to GE7, and/or the first capacitor electrode LE, there may be ITO, IZO, AZO, ITZO, ZnO, $SnO_2$, and the like.

A first interlayer insulating layer 114 may be provided on the first conductive layer. In an exemplary embodiment, the first interlayer insulating layer 114 may be a first interlayer insulating layer interposed between the first capacitor electrode LE and the second capacitor electrode UE. In an exemplary embodiment, the first interlayer insulating layer 114 may have a limited thickness falling within a predetermined range in order to secure sufficient capacitance of the storage capacitor Cst in the limited area. In an exemplary embodiment, the first interlayer insulating layer 114 may have a thickness that is similar to the thickness of the gate insulating layer 113. For example, the thickness of the first interlayer insulating layer 114 may range from 1000 Å to 1500 Å, for example, about 1400 Å, but the thickness of the first interlayer insulating layer 114 is not limited thereto.

The first interlayer insulating layer 114 may include one or more of inorganic layers and/or organic layers. For example, the first interlayer insulating layer 114 may be formed of an inorganic layer including $SiO_x$, $SiN_x$, or the like, but is not limited thereto. For example, the first interlayer insulating layer 114 may include an inorganic insulating material, such as $SiO_x$, $SiN_x$, SiON, SiOF, $AlO_x$, or like, or an organic insulating material, and may have a single-layer or multilayer structure including at least one of these materials.

A second conductive layer may be disposed on the first interlayer insulating layer 114. In an exemplary embodiment, the second conductive layer may be a second gate layer.

The second capacitor electrode UE, an initialization power line IPL, and a second bridge pattern BRP2 may be provided on the second conductive layer.

In an exemplary embodiment, the second capacitor electrode UE may cover the first capacitor electrode LE. The second capacitor electrode UE overlaps the first capacitor electrode LE while interposing the first interlayer insulating layer 114 therebetween, whereby the second capacitor electrode UE and the first capacitor electrode LE may form the storage capacitor Cst.

The initialization power line IPL may extend in the first direction DR1 in the display area AA, but is not limited thereto. The initialization power line IPL may receive power of the initialization power source Vint applied thereto.

The second bridge pattern BRP2 may include a first area extending in parallel to the first direction DR1 in the display area AA and a second area extending from one end of the first area in parallel to the second direction DR2, but the form of the second bridge pattern BRP2 is not limited thereto. The second bridge pattern BRP2 may be a pattern provided as a medium for electrically coupling a light-blocking layer PHL and a power line PL to each other. The second bridge pattern BRP2 such as the second area of the second bridge pattern BRP2 may be coupled to the power line PL through a tenth contact hole CT10, which is formed through a second interlayer insulating layer 115, and may be coupled to the light-blocking layer PHL through an eleventh contact hole CT11, which is formed through the buffer layer 112, the gate insulating layer 113, and the first interlayer insulating layer 114.

The second capacitor electrode UE, the initialization power line IPL, and the second bridge pattern BRP2, disposed on the second conductive layer, may be formed of the same material. For example, the second capacitor electrode UE, the initialization power line IPL, and the second bridge pattern BRP2 may be formed of predetermined second gate metal. In an exemplary embodiment, the second gate metal may be one of the metal materials described as an example of the first gate metal, but the second gate metal is not limited thereto. Also, the material of the second capacitor electrode UE, the initialization power line IPL, and the second bridge pattern BRP2 disposed on the second conductive layer is not necessarily limited to metal. That is, any material that is capable of providing sufficient conductivity for smoothly driving the pixels PXL may be used as the material of the second capacitor electrode UE, the initialization power line IPL, and the second bridge pattern BRP2. For example, the second capacitor electrode UE, the initialization power line IPL, and the second bridge pattern BRP2 disposed on the second conductive layer may be formed of a conductive polymer or conductive metal oxide.

The second interlayer insulating layer 115 may be provided on the second conductive layer. In an exemplary embodiment, the second interlayer insulating layer 115 may be a second interlayer insulating layer. The second interlayer insulating layer 115 may have a thickness greater than the thicknesses of the gate insulating layer 113 and the first interlayer insulating layer 114. For example, the thickness of the second interlayer insulating layer 115 may be equal to or greater than the sum of the thickness of the gate insulating layer 113 and that of the first interlayer insulating layer 114. For example, the second interlayer insulating layer 115 may have a thickness of about 5000 Å, but the thickness thereof is not limited thereto. When the second interlayer insulating layer 115 is formed so as to have a thickness that is greater than the sum of the thickness of the gate insulating layer 113 and that of the first interlayer insulating layer 114, electrical stability between the components disposed below the second interlayer insulating layer 115 and the components disposed above the second interlayer insulating layer 115 may be secured. Accordingly, a short defect may be effectively prevented.

The second interlayer insulating layer 115 may include one or more inorganic layers and/or organic layers. For example, the second interlayer insulating layer 115 may be formed of an inorganic layer including $SiO_x$, $SiN_x$, or the like, but is not limited thereto. For example, the second interlayer insulating layer 115 may include an inorganic insulating material, such as, $SiO_x$, $SiN_x$, SiON, SiOF, $AlO_x$, or the like, or an organic insulating material, and may have a single-layer or multilayer structure including at least one of these materials.

A third conductive layer may be disposed on the second interlayer insulating layer 115. In an exemplary embodiment, the third conductive layer may be a source-drain layer.

A data line Dj, the power line PL, a connection line CNL, a first bridge pattern BRP1, and an auxiliary connection line AUX may be provided on the third conductive layer.

The data line Dj may be coupled to the second source electrode SE2 through a sixth contact hole CT6, which is formed through the gate insulating layer 113, the first interlayer insulating layer 114, and the second interlayer insulating layer 115.

The power line PL may be coupled to the second capacitor electrode UE, which is the upper electrode of the storage capacitor Cst, through a third contact hole CT3, which is formed through the second interlayer insulating layer 115. Also, the power line PL may be coupled to the fifth source electrode SE5 through a fifth contact hole CT5, which is formed through the gate insulating layer 113, the first interlayer insulating layer 114, and the second interlayer insulating layer 115.

The power line PL may be further coupled to the second bridge pattern BRP2 through the tenth contact hole CT10, which is formed through the second interlayer insulating layer 115. Because the second bridge pattern BRP2 is coupled to the light-blocking layer PHL through the eleventh contact hole CT11, the power line PL may be electrically coupled to the light-blocking layer PHL.

The connection line CNL may be coupled to the first gate electrode GE1 through the first contact hole CT1, which is formed through the first interlayer insulating layer 114 and the second interlayer insulating layer 115. Also, the connection line CNL may be coupled to the third drain electrode DE3 and the fourth source electrode SE4 through the second contact hole CT2, which is formed through the gate insulating layer 113, the first interlayer insulating layer 114, and the second interlayer insulating layer 115.

The first bridge pattern BRP1 may be a pattern provided as a medium for coupling the sixth drain electrode DE6 and the first electrode AD between the sixth drain electrode DE6 and the first electrode AD. Such a first bridge pattern BRP1 may be coupled to the sixth drain DE6 and the seventh source electrode SE7 through the fourth contact holes CT4, which are formed through the gate insulating layer 113, the first interlayer insulating layer 114, and the second interlayer insulating layer 115.

The auxiliary connection line AUX may be coupled to the initialization power line IPL through the eighth contact hole CT8, which is formed through the second interlayer insulating layer 115. Further, the auxiliary connection line AUX may be coupled to the seventh drain electrode DE7 through the ninth contact hole CT9, which is formed through the gate insulating layer 113, the first interlayer insulating layer 114, and the second interlayer insulating layer 115.

The data line Dj, the power line PL, the connection line CNL, the first bridge pattern BRP1 and/or the auxiliary connection line AUX, which are arranged on the third conductive layer, may be formed of the same material. For example, the data line Dj, the power line PL, the connection line CNL, the first bridge pattern BRP1 and/or the auxiliary connection line AUX may be formed of a predetermined source/drain metal.

The source/drain metal may be, but is not limited to, one of metal materials presented as examples of the first and/or second gate metal in the above description. Also, the materials forming the data line Dj, the power line PL, the connection line CNL, the first bridge pattern BRP1 and/or the auxiliary connection line AUX, which are arranged on the third conductive layer, are not necessarily limited to metal. That is, any type of material may be used as the material forming the data line Dj, the power line PL, the connection line CNL, the first bridge pattern BRP1 and/or the auxiliary connection line AUX as long as the material is capable of providing sufficient conductivity to such an extent as to smoothly drive pixels PXL. For example, the data line Dj, the power line PL, the connection line CNL, the first bridge pattern BRP1 and/or the auxiliary connection line AUX may be formed of a conductive polymer or conductive metal oxide.

At least two of the first gate metal, the second gate metal, and the source/drain metal may be made of the same material. For example, the first gate metal and the second gate metal may be made of the same material even if they are arranged on different layers. However, exemplary embodiments are not limited thereto. For example, in other embodiments, the first gate metal, the second gate metal, and the source/drain metal may be made of different materials, respectively.

On the third conductive layer, the protective layer 116 may be provided. In an exemplary embodiment, the protective layer 116 may include a passivation layer and/or a planarization layer. The protective layer 116 may include the seventh contact hole CT7 for exposing a part of the first bridge pattern BRP1.

A light-emitting element LD may be provided on the protective layer 116. The light-emitting element LD may include the first electrode AD, the second electrode CD, and the emission layer EML provided between the first and second electrodes AD and CD.

In an exemplary embodiment, the protective layer 116 may have a thickness of 1500 Å to 1800 Å, for example, a thickness of about 1600 Å, but the thickness of the protective layer 116 is not limited thereto.

At least one of the first electrode AD and the second electrode CD may be a transmissive electrode. For example, in a case where the light-emitting element LD is a bottom-emission type organic light emitting element, the first electrode AD may be a transmissive electrode, and the second electrode CD may be a reflective electrode. In the case where the light-emitting element LD is a top-emission type organic light-emitting element, the first electrode may be a reflective electrode, and the second electrode may be a transmissive electrode. Also, in a case where the light-emitting element LD is a double-side emission type organic light-emitting element, both the first electrode AD and the second electrode CD may be transmissive electrodes. Hereinafter, a case where the light-emitting element LD is a top-emission type organic light-emitting element and the first electrode AD is an anode electrode will be described by way of example. Further, in the illustrated embodiment, the light-emitting element LD is used as a light source, but exemplary embodiments are not limited thereto. For example, the light-emitting element LD may be replaced with another type of light-emitting element.

The first electrode AD may be provided on the protective layer 116. The first electrode AD may be coupled to the first bridge pattern BRP1 through the seventh contact hole CT7, which is formed through the protective layer 116. Since the first bridge pattern BRP1 is coupled to the sixth drain electrode DE6 and the seventh source electrode SE7 through the fourth contact hole CT4, the first electrode AD may be ultimately coupled to the sixth drain electrode DE6 and the seventh source electrode SE7 through the first bridge pattern BRP1.

The first electrode AD may include a reflective layer which is capable of reflecting light, and a transparent conductive layer which is disposed on the top or bottom of the reflective layer. At least one of the transparent conductive layer and the reflective layer may be coupled to the sixth drain electrode DE6 and the seventh source electrode SE7.

The reflective layer may include material that is capable of reflecting light. For example, the reflective layer may include at least one of aluminum (Al), silver (Ag), chrome (Cr), molybdenum (Mo), platinum (Pt), nickel (Ni), and an alloy thereof.

The transparent conductive layer may include transparent conductive oxide. For example, the transparent conductive layer may include at least one transparent conductive oxide of Indium Tin Oxide (ITO), Indium Zinc Oxide (IZO), Aluminum Zinc Oxide (AZO), gallium doped zinc oxide (GZO), zinc tin oxide (ZTO), Gallium tin oxide (GTO) and fluorine doped tin oxide (FTO).

The emission layer EML may be disposed on the exposed surface of the first electrode AD. The emission layer EML may have a multilayer thin-film structure including at least a light generation layer (LGL). For instance, the emission layer EML may include a hole injection layer (HIL) into which holes are injected; a hole transport layer (HTL) which has excellent hole transportation performance and restrains movement of electrons that have not been coupled with holes in the light generation layer and thus increases chances of recombination between holes and electrons; the light generation layer which emits light by recombination between injected electrons and holes; a hole blocking layer (HBL) which restrains movement of holes that have not been coupled with electrons in the light generation layer; an electron transport layer (ETL) which is provided to smoothly transport electrons to the light generation layer; and an electron injection layer (EIL) into which electrons are injected.

The color of light generated from the light generation layer may be, but is not limited to, one of red, green, blue, and white. For example, the color of light generated from the light generation layer of the emission layer EML may be one of magenta, cyan, and yellow.

The hole injection layer, the hole transport layer, the hole blocking layer, the electron transport layer, and the electron injection layer may be common layers coupled between adjacent emission areas.

The second electrode CD may be a semi-transmissive reflective layer. For example, the second electrode CD may be a thin-film metal layer having a thickness allowing light emitted from the emission layer EML to pass therethrough. The second electrode CD may allow part of light generated from the emission layer EML to pass therethrough, and may reflect the remaining part of the light generated from the emission layer EML.

In an exemplary embodiment, the second electrode CD may include material having a work function lower than that of the transparent conductive layer. For instance, the second electrode CD may include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), and an alloy thereof.

The part of the light emitted from the emission layer EML may not pass through the second electrode CD, and light reflected from the second electrode CD is reflected again from the reflective layer. That is, light emitted form the emission layer EML may resonate between the reflective layer and the second electrode CD. The light extraction efficiency of organic light-emitting elements LD may be enhanced due to the resonance of light.

A pixel-defining layer (or bank layer) 117 for defining the emission area of each pixel PXL may be provided on the first substrate SUB1 on which the first electrode AD, etc. are arranged. The pixel-defining layer 117 may expose a top surface of the first electrode AD and protrude from the first substrate SUB1 along the periphery of each emission area.

The emission layer EML may be provided in the emission area of each pixel enclosed by the pixel-defining layer 117. The second electrode CD may be provided on the emission layer EML. Any one of the first electrode AD and the second electrode CD may be an anode electrode, and the other may be a cathode electrode. For example, the first electrode AD may be an anode electrode, and the second electrode CD may be a cathode electrode.

The pixel-defining layer 117 may include organic insulating material. For example, the pixel-defining layer 117 may include at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane-based resin, and silane-based resin.

The first protective layer PTL1 covering the second electrode CD may be provided on the second electrode CD. The first protective layer PTL1 may be formed of a thin-film encapsulation layer. In an exemplary embodiment, the thin-film encapsulation layer may be replaced with another type of encapsulation layer or encapsulation substrate, or at least one protective layer or the like.

The thin-film encapsulation layer may prevent a permeation of oxygen and moisture. For this operation, the thin-film encapsulation layer may include an inorganic layer. The inorganic layer may include at least one of silicon oxide, silicon nitride, silicon oxynitride, aluminum oxide, titanium oxide, zirconium oxide, and tin oxide.

Respective circuit elements and lines, which are arranged in the first surface of the first substrate SUB1 in a range from the buffer layer 112 to the protective layer 116, may constitute the circuit element layer BPL of the display device 10 and/or the fingerprint sensor. The light-emitting elements LD arranged in respective pixels PXL and the thin-film encapsulation layers arranged therebetween in a range from the first electrode AD to the second electrode CD may constitute the light-emitting element layer LDL of the display device 10 and/or the fingerprint sensor.

Referring further to FIGS. 15 and 16, the pixel PXL may include a light transmission hole LTH formed in at least one conductive layer of the circuit-element layer BPL. The display area AA may include a plurality of pixels PXL, each including the light transmission hole LTH.

The light transmission hole LTH may be formed a region overlapping light transmissive areas defined by respective conductive layers of the circuit-element layer BPL. For example, the light transmission hole LTH may be formed by light transmissive areas of multilayer including at least two of the semiconductor layer in which the active patterns ACT1 to ACT7 of the circuit-element layer BPL are arranged, the first conductive layer in which the gate electrodes GE1 to GE7 are arranged, the second conductive layer in which the second capacitor electrode UE and the first bridge pattern BRP1 is arranged, and the third conductive layer in which the power line PL or the like is arranged.

In accordance with the illustrated embodiment, a light transmission hole array for receiving reflected light may be formed to be integrated with the light-emitting element layer LDL and the circuit-element layer BPL without additional layer being formed in the circuit-element layer BPL. Accordingly, the module thickness of the display device 10 may be reduced.

The arrangement and shapes of the light transmission holes LTH are not limited to those illustrated in FIGS. 15 and 16. In exemplary embodiments, each light transmission hole LTH may be formed in another area, for example, an area including an opening OPN formed in the first gate electrode GE1. In such an exemplary embodiment, a layout structure may be modified in various manners so that a conductive layer is not disposed in the light transmission hole LTH.

The size (width or diameter) of the light transmission hole LTH may be determined depending on the sizes of the light transmissive areas. For example, the width of the light transmission hole LTH may be determined to be the smallest width, among the widths of the light transmissive areas.

The light transmissive areas forming the light transmission hole LTH may be formed such that at least portions thereof overlap the pinholes PIH of the light-blocking layer, PHL In an exemplary embodiment, the width of the light transmission hole LTH may be equal to or different from the widths of the pinholes PIH.

The light transmission hole LTH may be formed in all or at least some of the pixels PXL arranged in the display area AA. For example, the light transmission hole LTH may be formed in the pixels PXL which overlap the pinhole PIH formed in the light-blocking layer PHL, among the pixels PXL arranged in the display area AA. In an exemplary embodiment, in pixels PXL in which the light transmission hole LTH is not formed, the distance between the emission control line Ei and the initialization power line IPL and/or the distance between the fifth source electrode SE5 and the sixth drain electrode DE6 may be shorter than that in the pixel PXL in which the light transmission hole LTH is formed.

The light-blocking layer PHL may be interposed between the first substrate SUB1 and the buffer layer 112 to selectively transmit incident light. The light-blocking layer PHL may be an opaque metal layer including one or more pinholes PIH.

The light-blocking layer PHL may be coupled to the second bridge pattern BRP2 through the eleventh contact hole CT11, which is formed through the buffer layer 112, the gate insulating layer 113, and the first interlayer insulating layer 114. Since the second bridge pattern BRP2 may be coupled to the power line PL through the tenth contact hole CT10, the light-blocking layer PHL may be electrically coupled to the power line PL. Accordingly, power applied through the power line PL, for example, the power of the first power source ELVDD, may be supplied to the light-blocking layer PHL. The power applied to the light-blocking layer PHL may change the characteristics of transistors arranged in the circuit-element layer BPL and the light-emitting element layer LDL may receive increased current, thus increasing the intensity of light emitted from the emission layer EML. Then, the intensity of light having reached the photosensors PHS provided below the first substrate SUB1 after passing through the light transmission hole LTH and the pinholes PIH may increase, and thus accuracy of fingerprint sensing by the photosensors PHS may be improved.

In an exemplary embodiment, the pinholes PIH in the light-blocking layer PHL may be arranged at a spacing lower than that of the pixels PXL provided in the display area AA. In this case, some of the pixels PXL provided in the display area AA may include a light transmission hole LTH overlapping the corresponding pinhole PIH, and others may not overlap the pinhole PIH and may include no light transmission hole LTH. In this embodiment, the second bridge pattern BRP2 may be provided in all pixels PXL. That is, even in pixels which do not overlap the pinhole PIH, the power line PL may be electrically coupled to the light-blocking layer PHL through the second bridge pattern BRP2. Thus, the supply of power to the light-blocking layer PHL may be more efficiently performed. However, exemplary embodiments are not limited thereto, and the second bridge pattern BRP2 may not be provided in some pixels PXL, e.g., pixels PXL in which the light transmission hole LTH is not formed.

Figure 17:
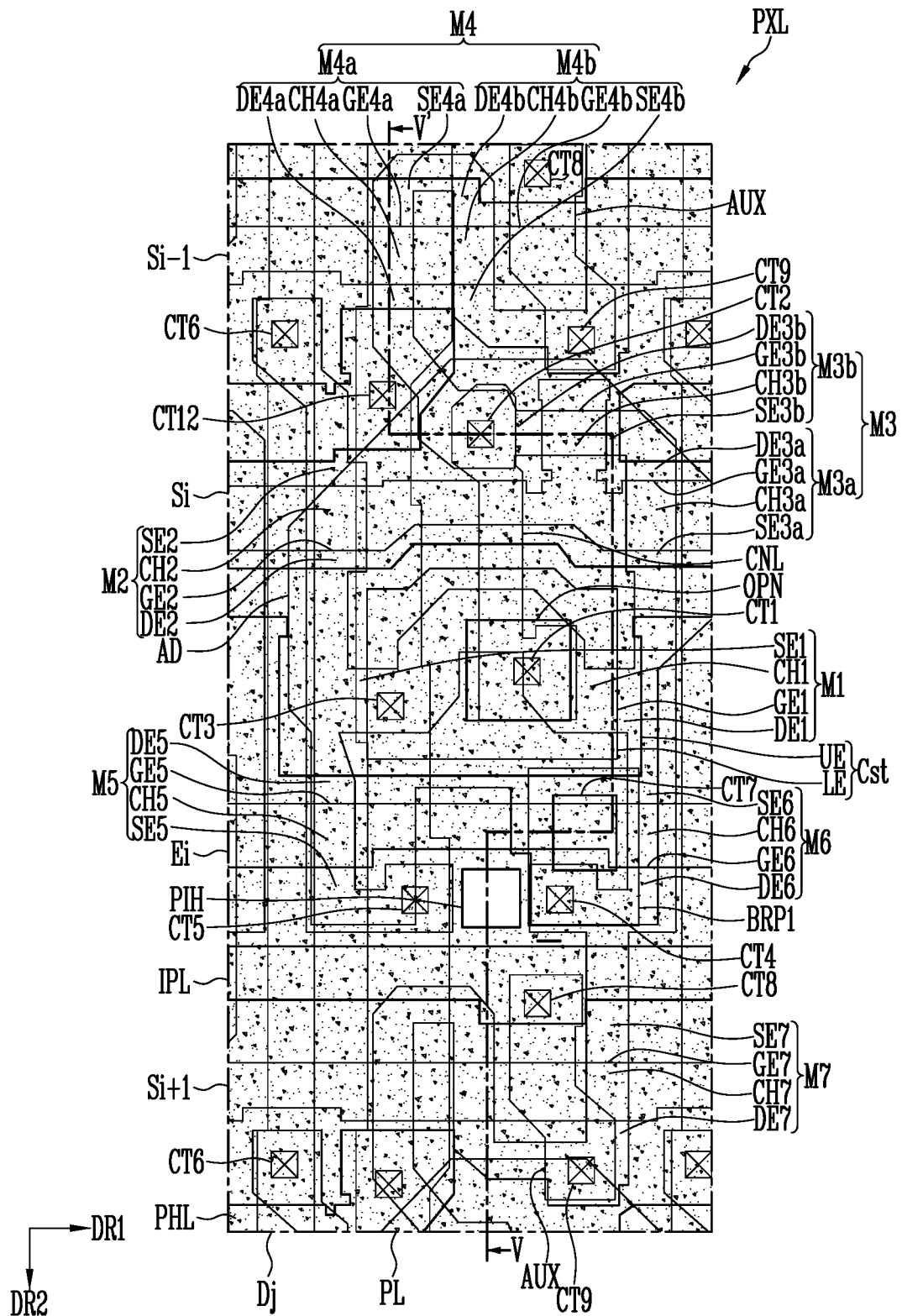
FIG. 17 is a plan view of another exemplary embodiment of a layout including the pixel of FIG. 14 and the light-blocking layer constructed according to the principles of the invention.
Figure 18:
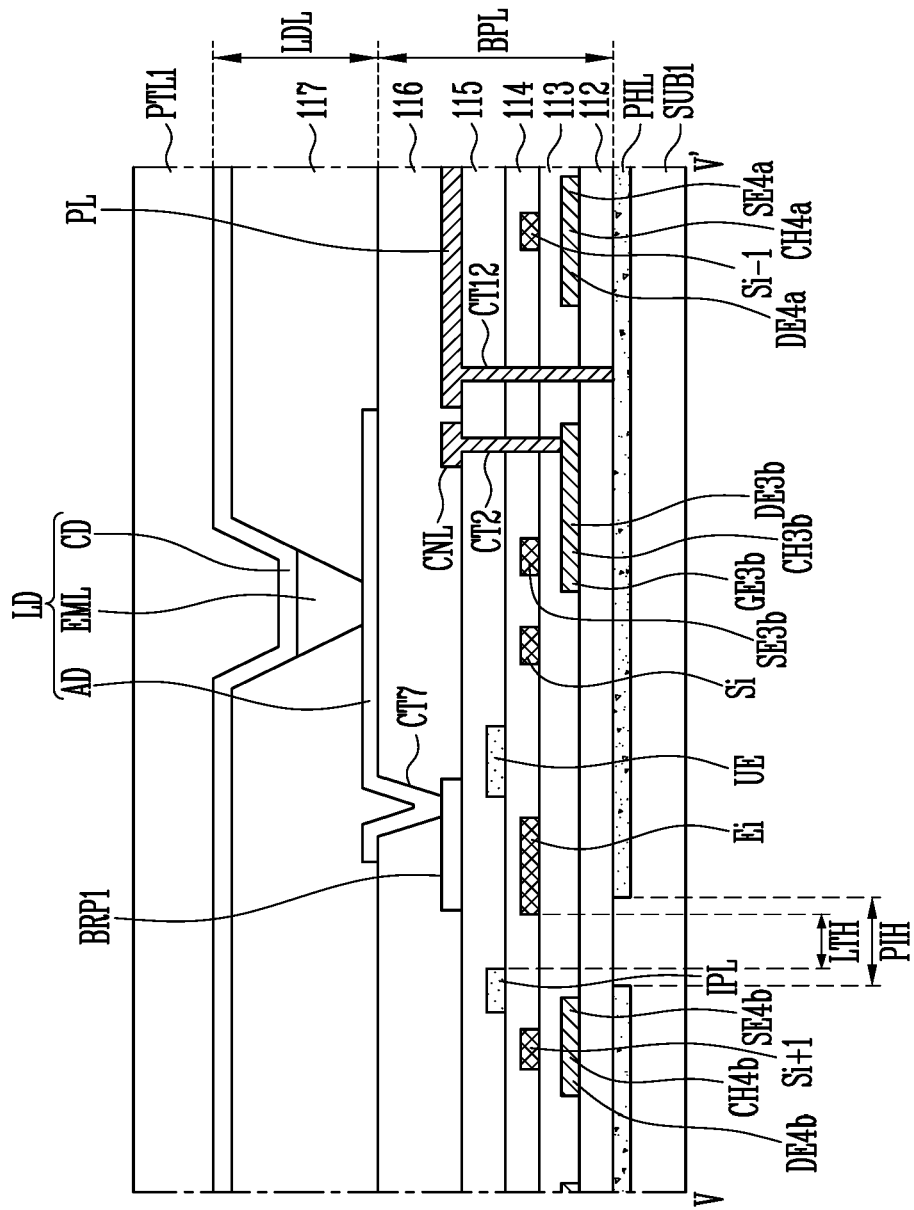
FIG. 18 is a cross-sectional view taken along line V-V of FIG. 17.

FIG. 17 is a plan view of another exemplary embodiment of a layout including the pixel of FIG. 14 and the light-blocking layer constructed according to the principles of the invention. FIG. 18 is a cross-sectional view taken along line V-V of FIG. 17. In detail, FIG. 17 illustrates the layout of a pixel PXL that include a light transmission hole LTH overlapping the pinhole PIH of the light-blocking layer PHL, among arbitrary pixels PXL arranged in the display area AA of FIGS. 1A to 1C.

In description of the embodiment of FIGS. 17 and 18, for convenience of description, a scan line in an (i−1)-th row is referred to as an (i+1)-th scan line Si+1, an emission control line in an i-th row is referred to as an emission control line Ei, a data line in a j-th column is referred to as a data line Dj, and a power line in the j-th column, e.g., a power line in the j-th column in which first power ELVDD is applied is referred to as a power line PL.

The pixel PXL of FIGS. 17 and 18 is substantially the same as the embodiment of FIGS. 15 and 16, except that the light-blocking layer PHL is coupled to the power line PL without passing through the second bridge pattern BRP2. Therefore, the same reference numerals are assigned to the same components as those in FIGS. 15 and 16, and thus detailed descriptions thereof will be omitted to avoid redundancy.

Referring to FIGS. 17 and 18, the power line PL and the light-blocking layer PHL may be electrically coupled to each other through a twelfth contact hole CT12, which is formed through the buffer layer 112, the gate insulating layer 113, the first interlayer insulating layer 114, and the second interlayer insulating layer 115. Accordingly, power applied through the power line PL, for example, first power ELVDD, may be applied to the light-blocking layer PHL.

The location of the twelfth contact hole CT12 is not limited to examples illustrated in FIGS. 17 and 18. The twelfth contact hole CT12 may be formed in any area as long as the power line PL and the light-blocking layer PHL overlap each other in the area.

The display device may change element characteristics of a transistor in a pixel by transferring a voltage applied to a certain component in the pixel to a light-blocking layer, thus improving light-emission efficiency of a light-emitting element.

Further, the display device may be implemented as a thin-film structure while reducing manufacturing costs by assigning a function of blocking specific light to a certain component of a display panel.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:
1. A display device, comprising:
a substrate including a display area having a plurality of pixel areas and a non-display area surrounding at least one side of the display area;
a light-blocking layer disposed on a first surface of the substrate and comprising a single layer having light transmissive areas disposed across substantially the entire width of the display area to allow incident light to pass therethrough;

a circuit-element layer disposed on the light-blocking layer and comprising a plurality of conductive layers, at least one first contact hole, and a semiconductor layer in the display area;

a light-emitting element layer disposed on the circuit-element layer and including light-emitting elements; and a sensor layer disposed on a second surface of the substrate opposing the first surface and extending across substantially the entire width of the display area to sense the light passing through the light transmissive areas, wherein the light-blocking layer is electrically coupled to at least one of the plurality of conductive layers through the at least one first contact hole disposed in the display area, and the light-blocking layer is disposed between the semiconductor layer and the sensor layer, and wherein the at least one of the plurality of conductive layers electrically coupled to the light-blocking layer is disposed between the light-emitting element layer and the semiconductor layer.

2. The display device according to claim 1, wherein the light-blocking layer is configured to receive power through the at least one of the plurality of conductive layers.

3. The display device according to claim 2, wherein the plurality of conductive layers comprises a power line extending in one direction and configured to receive the power.

4. The display device according to claim 3, wherein the light-blocking layer is electrically coupled to the power line through at least one second contact hole in the non-display area.

5. The display device according to claim 3, wherein the light-blocking layer comprises at least one extension part extending from at least one portion of a periphery of the light-blocking layer towards a perimeter of the substrate and disposed adjacent to the power line in the non-display area.

6. The display device according to claim 5, wherein the at least one extension part is electrically coupled to the power line through at least one second contact hole in the non-display area.

7. The display device according to claim 6, wherein:
the plurality of conductive layers further comprises a connector interposed between the at least one extension part and the power line,
the at least one extension part is electrically coupled to the connector through at least one third contact hole of the at least one second contact hole, and
the connector is electrically coupled to the power line through at least one fourth contact hole of the at least one second contact hole.

8. The display device according to claim 7, wherein:
the connector comprises a bridge pattern;
the at least one extension part comprises a protrusion pattern configured to protrude from the at least one extension part towards the power line to overlap the power line, and
the protrusion pattern is electrically coupled to the power line through the at least one second contact hole.

9. The display device according to claim 6, wherein:
the power line comprises a protrusion pattern configured to protrude towards the at least one extension part of the light-blocking layer to overlap the extension part, and the protrusion pattern is electrically coupled to the at least one extension part through the at least one second contact hole.

10. The display device according to claim 5, wherein the non-display area comprises:
a pad area comprising pads to be coupled to an external controller;
a bending area adjacent to the pad area and bendable about a bending axis; and
a wiring area interposed between the bending area and the display area, and
wherein the plurality of conductive layers further comprises a plurality of lines in the wiring area, and the plurality of lines and the power line extend from the pads to the display area.

11. The display device according to claim 10, wherein the at least one extension part is electrically coupled to the power line through at least one second contact hole in the wiring area.

12. The display device according to claim 10, wherein the power line has a width greater than that of the plurality of lines in the wiring area.

13. The display device according to claim 10, wherein the non-display area further comprises a dummy area adjacent to the display area, the display area being disposed between the dummy area and the wiring area, and
wherein the at least one extension part is disposed in at least one of the wiring area and the dummy area.

14. The display device according to claim 3, wherein the light-blocking layer is electrically coupled to the power line through the at least one first contact hole in the display area.

15. The display device according to claim 14, wherein the semiconductor layer comprises an active pattern forming at least one transistor, and the plurality of conductive layers in the display area further comprises:
a first gate layer comprising a gate electrode overlapping the active pattern;
a second gate layer comprising at least one capacitor electrode; and
a source-drain layer comprising the power line and a conductive line coupled to the active pattern.

16. The display device according to claim 15, wherein the at least one first contact hole comprises a second contact hole and a third contact hole, and the second gate layer further comprises a connector electrically coupled to the light-blocking layer through the second contact hole and electrically coupled to the power line through the third contact hole.

17. The display device according to claim 16, wherein the connector is a bridge pattern that comprises:
a first area extending in parallel to the power line; and
a second area extending from a first end of the first area in a direction perpendicular to the first area.

18. The display device according to claim 17, wherein the first area overlaps the power line and is electrically coupled to the second contact hole and the third contact hole.

19. The display device according to claim 1, wherein the plurality of conductive layers comprises a light transmitting layer having light transmission holes overlapping the light transmissive areas.

20. The display device according to claim 1, wherein the light transmissive areas comprise pinholes.

21. The display device according to claim 1, wherein the plurality of conductive layers and the semiconductor layer comprise a pixel circuit electrically connected between a first power line and a second power line, a voltage of the first power line being higher than a voltage of the second power line,
- one of the light-emitting elements is electrically connected between the pixel circuit and the second power line,
- the light-blocking layer is electrically coupled to the first power line through the at least one first contact hole.

* * * * *